United States Patent
Lee et al.

(10) Patent No.: US 12,520,688 B2
(45) Date of Patent: Jan. 6, 2026

(54) DISPLAY PANEL

(71) Applicant: Samsung Display Co., Ltd., Yongin-si (KR)

(72) Inventors: Doo-Young Lee, Hwaseong-si (KR); Bogyeong Kim, Seongnam-si (KR); Tak-Young Lee, Anyang-si (KR); Sang-Uk Lim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 299 days.

(21) Appl. No.: 18/111,998

(22) Filed: Feb. 21, 2023

(65) Prior Publication Data

US 2023/0269984 A1     Aug. 24, 2023

(30) Foreign Application Priority Data

Feb. 23, 2022 (KR) ........................ 10-2022-0023581

(51) Int. Cl.
*H10K 59/131* (2023.01)

(52) U.S. Cl.
CPC .............................. *H10K 59/1315* (2023.02)

(58) Field of Classification Search
CPC ............................................... H10K 59/1315
USPC ........................................................ 257/40
See application file for complete search history.

(56) References Cited

U.S. PATENT DOCUMENTS

| 6,271,548 | B1 | 8/2001 | Umemoto et al. | |
| 8,704,991 | B2 | 4/2014 | Cahng et al. | |
| 11,508,796 | B2 | 11/2022 | Park et al. | |
| 2016/0148985 | A1* | 5/2016 | Park | H10D 86/441 257/40 |
| 2017/0005156 | A1* | 1/2017 | Kim | G09G 3/3233 |
| 2019/0131360 | A1* | 5/2019 | Lee | H10K 59/131 |

FOREIGN PATENT DOCUMENTS

| KR | 10-0359295 | 11/2002 |
| KR | 10-0681039 | 2/2007 |
| KR | 10-1159318 | 6/2012 |
| KR | 10-2017-0126056 | 11/2017 |
| KR | 10-2021-0009486 A | 1/2021 |

* cited by examiner

*Primary Examiner* — Xia L Cross

(57) ABSTRACT

A display panel includes a base layer, a first conductive layer disposed on the base layer and including a power pattern, a second conductive layer disposed on the first conductive layer, and a first insulating layer disposed between the first conductive layer and the second conductive layer. The first insulating layer is provided with at least one first contact hole defined therethrough and disposed at an upper side in a plan view and at least one second contact hole defined therethrough and disposed at a lower side in a plan view, the first conductive layer is electrically connected to the second conductive layer via the at least one first contact hole and the at least one second contact hole, and a number of the at least one first contact hole is equal to a number of the at least one second contact hole.

20 Claims, 21 Drawing Sheets

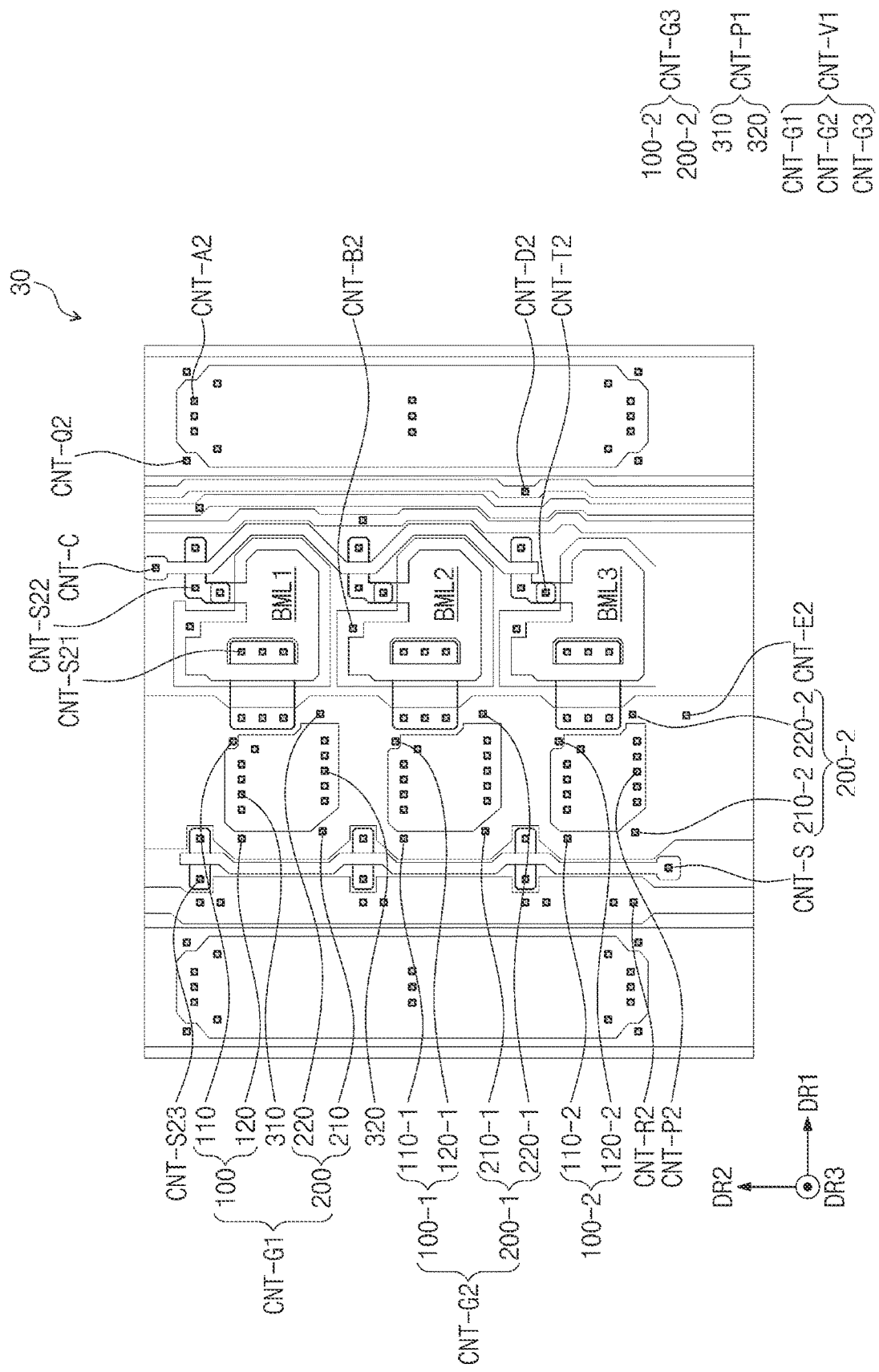

DISPLAY PANEL

CROSS-REFERENCE TO RELATED APPLICATION

This application claims priority to and benefits of Korean Patent Application No. 10-2022-0023581 under 35 U.S.C. § 119, filed in the Korean Intellectual Property Office on Feb. 23, 2022, the entire contents of which are incorporated herein by reference.

BACKGROUND

1. Technical Field

The disclosure relates to a display panel including a circuit element with improved reliability.

2. Description of the Related Art

A display panel includes pixels and driving circuits, e.g., a scan driving circuit and a data driving circuit, to control the pixels. Each of the pixels includes a display element and a pixel driving circuit controlling the display element. The pixel driving circuit includes transistors electrically connected to each other.

The scan driving circuit, the data driving circuit, and the pixels are formed through a same process. The scan driving circuit and the data driving circuit include the transistors electrically connected to each other.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display panel with a reduced power consumption and an improved display quality.

However, embodiments of the disclosure are not limited to those set forth herein. The above and other embodiments will become more apparent to one of ordinary skill in the art to which the disclosure pertains by referencing the detailed description of the disclosure given below.

Embodiments of the disclosure provide a display panel including a base layer, a first conductive layer disposed on the base layer and including a power pattern, a second conductive layer disposed on the first conductive layer, and a first insulating layer disposed between the first conductive layer and the second conductive layer. The first insulating layer is provided with at least one first contact hole defined through the first insulating layer and disposed at an upper side of the first insulating layer in a plan view and at least one second contact hole defined through the first insulating layer and disposed at a lower side of the first insulating layer in a plan view. The first conductive layer is electrically connected to the second conductive layer via the at least one first contact hole and the at least one second contact hole. A number of the at least one first contact hole is equal to a number of the at least one second contact hole.

The second conductive layer may include at least one additional power pattern overlapping the power pattern in a plan view, and the power pattern may be electrically connected to the at least one additional power pattern via the at least one first contact hole and the at least one second contact hole.

The at least one additional power pattern may include an upper edge and a lower edge. The at least one first contact hole may be adjacent to the upper edge. The at least one second contact hole may be adjacent to the lower edge.

The at least one first contact hole and the at least one second contact hole may have a same size.

The at least one first contact hole may include at least one first hole and at least one second hole spaced apart from the at least one first hole in a first direction. The at least one second contact hole may include at least one third hole and at least one fourth hole spaced apart from the at least one third hole in the first direction. The at least one first hole may be adjacent to the at least one third hole in a second direction intersecting the first direction. The at least one second hole may be adjacent to the at least one fourth hole in the second direction.

A number of the at least one first hole may be equal to a number of the at least one third hole, and a number of the at least one second hole may be equal to a number of the at least one fourth hole.

The at least one first hole and the at least one third hole may have a same size, and the at least one second hole and the at least one fourth hole may have a same size.

The display panel may further include a third conductive layer disposed between the first conductive layer and the second conductive layer and a second insulating layer disposed between the first conductive layer and the third conductive layer.

The second insulating layer may be provided with at least one third contact hole disposed at an upper side of the second insulating layer in a plan view and at least one fourth contact hole disposed at a lower side of the second insulating layer in a plan view. The first conductive layer may be electrically connected to the third conductive layer via the at least one third contact hole and the at least one fourth contact hole. A number of the at least one third contact hole may be equal to a number of the at least one fourth contact hole.

The at least one third contact hole and the at least one fourth contact hole may have a same size.

The at least one additional power pattern may include a plurality of additional power patterns. The first insulating layer may include a plurality of contact hole groups respectively disposed between a corresponding one of the at least one additional power pattern and the power pattern. Each of the plurality of contact hole groups may include the at least one first contact hole and the at least one second contact hole, and a number of the at least one first contact hole may be equal to a number of the at least one second contact hole in each of the plurality of contact hole groups.

The display panel may further include a pixel including a transistor including a semiconductor pattern and a gate and a light emitting element electrically connected to the transistor, and the power pattern may be electrically connected to the pixel.

Embodiments of the disclosure provide a display panel including a base layer, a first conductive layer disposed on the base layer and including a power pattern, a second conductive layer disposed on the first conductive layer, and a first insulating layer disposed between the first conductive layer and the second conductive layer. In case that a current flows from a first side to a second side in a first direction, the first insulating layer is provided with at least one first contact hole adjacent to the first side in a plane and at least one second contact hole adjacent to the second side in the plane.

The first conductive layer is electrically connected to the second conductive layer via the at least one first contact hole and the at least one second contact hole. A number of the at least one first contact hole is equal to a number of the at least one second contact hole.

The current may flow to the at least one second contact hole after passing through the at least one first contact hole.

The at least one first contact hole and the at least one second hole may have a same size.

The at least one first contact hole may include a plurality of first contact holes and the at least one second contact hole may include a plurality of second contact holes.

The plurality of first contact holes may include at least one first hole and at least one second hole spaced apart from the at least one first hole in a second direction intersecting the first direction. The plurality of second contact holes may include at least one third hole and at least one fourth hole spaced apart from the at least one third hole in the second direction. The at least one first hole may be adjacent to the at least one third hole in the first direction. The at least one second hole may be adjacent to the at least one fourth hole in the first direction.

The current may flow from the at least one first hole to the at least one third hole and flow from the at least one second hole to the at least one fourth hole.

A number of the at least one first hole may be equal to a number of the at least one third hole, and a number of the at least one second hole may be equal to a number of the at least one fourth hole.

The at least one first hole and the at least one third hole may have a same size, and the at least one second hole and the at least one fourth hole may have a same size.

According to the above, a resistance of the power line may be reduced in the display panel.

According to the above, the first conductive layer and the second conductive layer, which include the power line, may be electrically connected to each other via the first contact hole and the second contact hole, and the number of the first contact holes at the upper side is the same as the number of the second contact holes at the lower side. Thus, a bottleneck phenomenon that increases a resistance in the current flow may be removed, and the display panel with reduced power consumption and heat may be provided.

BRIEF DESCRIPTION OF THE DRAWINGS

An additional appreciation according to the embodiments of the disclosure will become more apparent by describing in detail the embodiments thereof with reference to the accompanying drawings wherein:

FIGS. 6A to 6K are schematic plan views of the conductive patterns included in the pixel part for each layer based on the stack order according to an embodiment of the disclosure;

DETAILED DESCRIPTION OF THE EMBODIMENTS

Figure 1A:
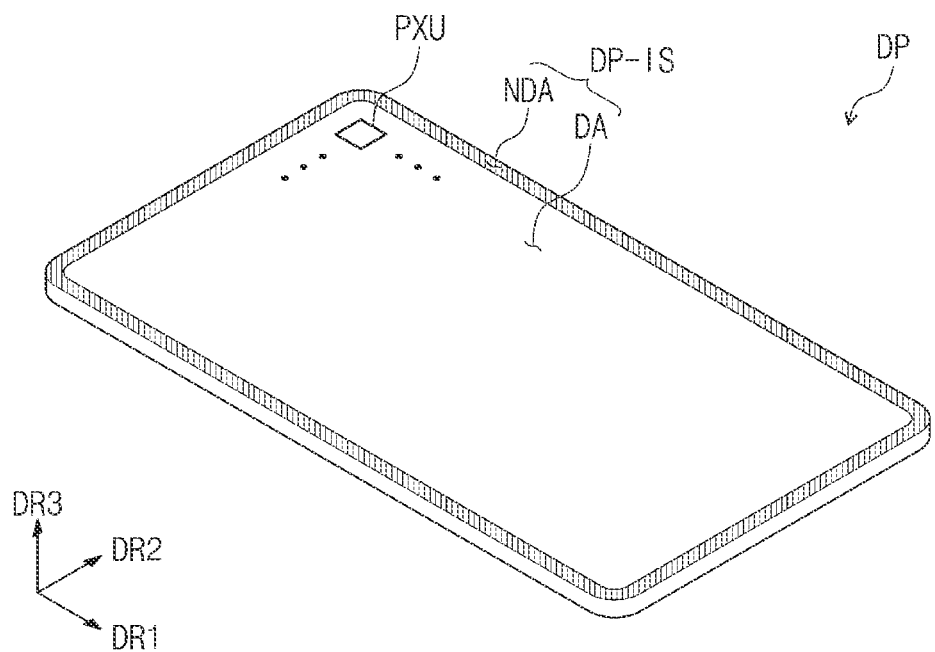
FIG. 1A is a schematic perspective view of a display panel according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

When an element, such as a layer, is referred to as being "on", "connected to" or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

As used herein, the term "and/or" may include any and all combinations of one or more of the associated listed items.

Although the terms "first," "second," etc. may be used herein to describe various types of elements, these elements should not be limited by these terms. These terms are only used to distinguish one element from another element. Thus, a first element discussed below could be termed a second element without departing from the teachings of the disclosure.

The terminology used herein is for the purpose of describing particular embodiments and is not intended to be limiting. As used herein, the singular forms, "a," "an," and "the" are intended to include the plural forms as well, unless the context clearly indicates otherwise.

Spatially relative terms, such as "beneath," "below," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art the disclosure, and should not be interpreted in an ideal or excessively formal sense unless clearly so defined herein.

Hereinafter, embodiments of the disclosure is described with reference to accompanying drawings.

Figure 1B:
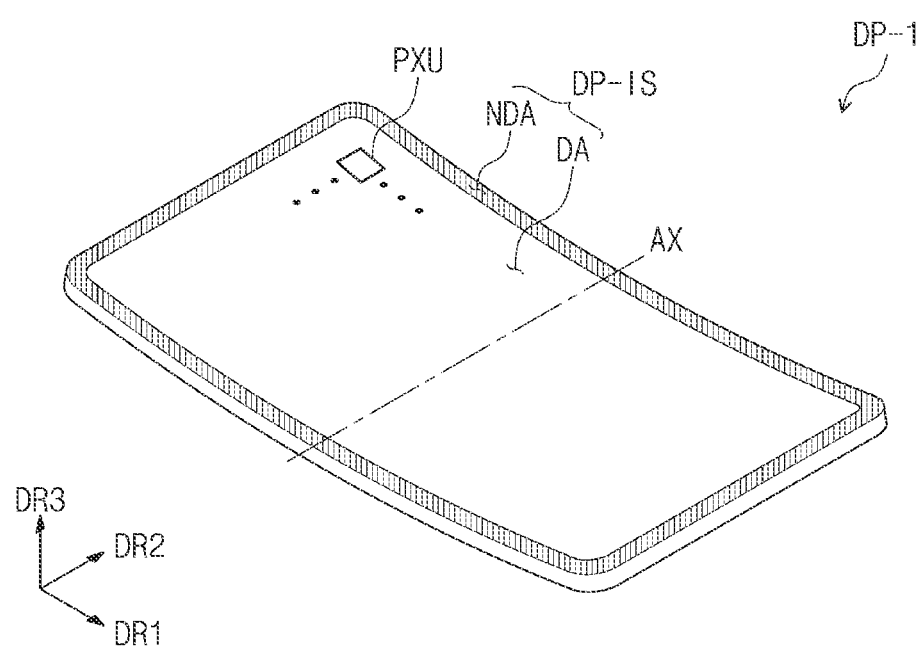
FIG. 1B is a schematic perspective view of a curved display panel according to an embodiment of the disclosure.
Figure 2:
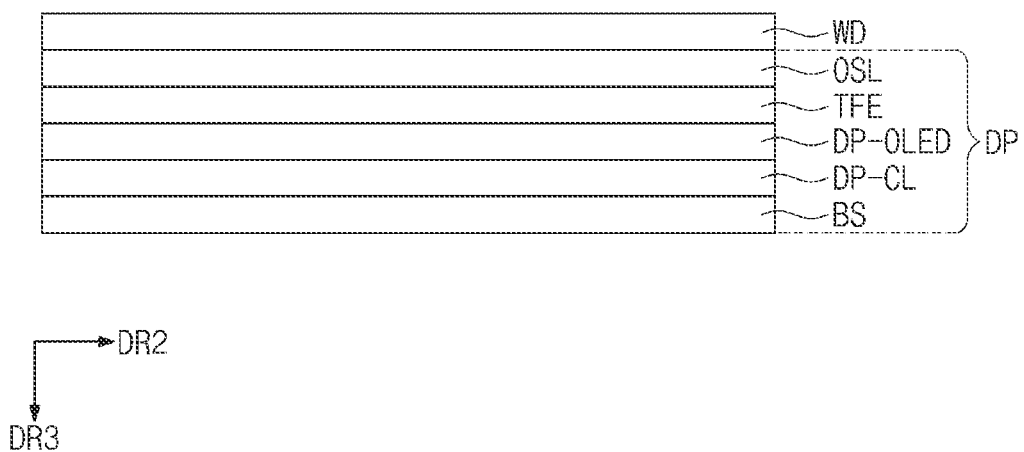
FIG. 2 is a schematic cross-sectional view of a display panel according to an embodiment of the disclosure.
Figure 3:
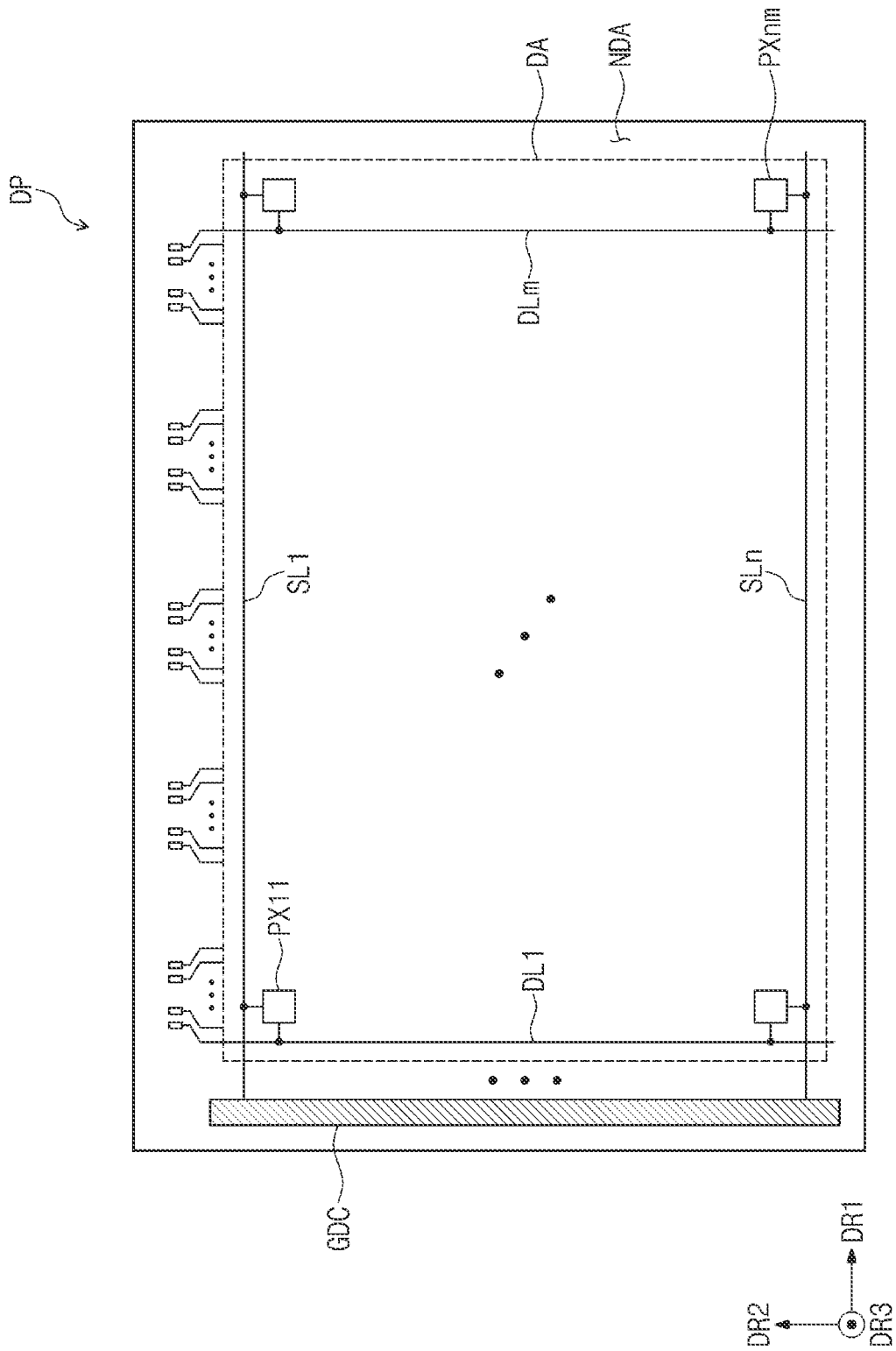
FIG. 3 is a schematic plan view of a display panel according to an embodiment of the disclosure.
Figure 4:
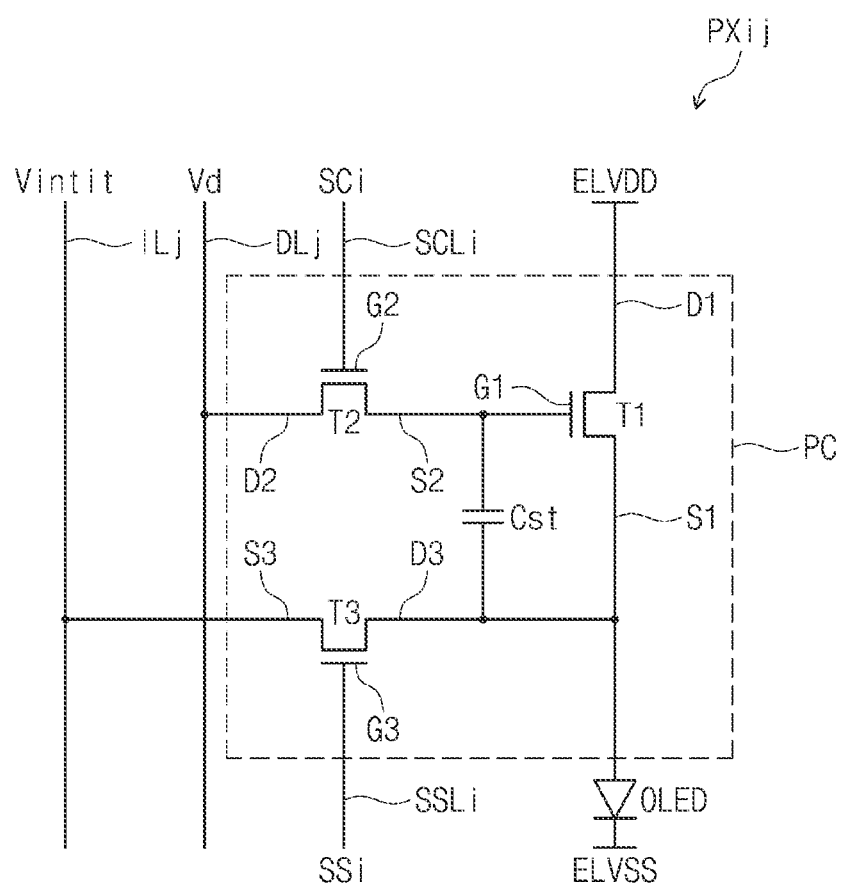
FIG. 4 is a schematic diagram of an equivalent circuit of a pixel according to an embodiment of the disclosure.

FIG. 1A is a schematic perspective view of a display panel DP according to an embodiment of the disclosure. FIG. 1B is a schematic perspective view of a curved display panel DP-1 according to an embodiment of the disclosure. FIG. 2 is a schematic cross-sectional view of the display panel DP according to an embodiment of the disclosure. FIG. 3 is a schematic plan view of the display panel DP according to an embodiment of the disclosure. FIG. 4 is a schematic diagram of an equivalent circuit of a pixel according to an embodiment of the disclosure.

Each of the display panels DP and DP-1 shown in FIGS. 1A and 1B may be a light emitting type display panel. For example, each of the display panels DP and DP-1 may be one of a liquid crystal display panel, an electrophoretic display panel, a microelectromechanical system (MEMS) display panel, an electrowetting display panel, an organic light emitting display panel, an inorganic light emitting display panel, and a quantum-dot display panel. The display panels DP and DP-1 may include a micro-light emitting element. As an example, the display panels DP and DP-1 may include a micro-LED element and/or a nano-LED element, however, the disclosure is not limited thereto.

Referring to FIG. 1A, the display panel DP may display an image through a display surface DP-IS. An upper surface of an uppermost position of the display panel DP may be defined as the display surface DP-IS. According to the disclosure, an upper surface of a window panel WD shown in FIG. 2 may be provided as the display surface DP-IS of the display panel DP.

The display surface DP-IS may be substantially parallel to a plane defined by a first direction DR1 and a second direction DR2. A third direction DR3 may indicate a normal line direction of the display surface DP-IS. For example, the third direction DR3 may be a thickness direction of the display panel DP. Front (or upper) and rear (or lower) surfaces of each layer (or each part) described below are distinguished from each other by the third direction DR3.

The display panel DP may include a display area DA and a non-display area NDA. A light emitting layer EML (e.g., refer to FIG. 7) of a pixel may be disposed in the display area DA and may not be disposed in the non-display area NDA. The non-display area NDA may be defined along an edge of the display surface DP-IS. The non-display area NDA may be adjacent to (e.g., may surround) the display area DA. According to an embodiment, the non-display area NDA may be omitted or may be disposed at only a side of the display area DA.

Referring to FIG. 1B, the display panel DP-1 may be curved in the first direction DR1 with respect to an imaginary axis AX extending in the second direction DR2. However, the disclosure is not limited thereto or thereby. According to an embodiment, the axis AX may extend in the first direction DR1, or the display panel DP-1 may be curved with respect to multiple axes extending in different directions from each other.

Each of the display panels DP and DP-1 may be a rollable display panel, a foldable display panel, or a slidable display panel. The display panels DP and DP-1 may have a flexible property and may be folded or rolled after being provided to a display device. Accordingly, the display panels DP and DP-1 may include a curved display surface or a three-dimensional display surface. The three-dimensional display surface of the display panels DP and DP-1 may include multiple display areas indicating different directions from each other.

FIGS. 1A and 1B show a pixel part (or unit pixel) PXU disposed in the display area DA. The pixel part PXU may include at least two pixels emitting different lights from each other. As an example, the pixel part PXU may be an area in which pixels respectively emitting green, red, and blue lights are disposed. An emission area, a shape, and an arrangement of each of the pixels included in the pixel part PXU is not limited thereto. As an example, the pixels included in the pixel part PXU may have different emission areas from each other. Each light emitting area PXA (e.g., refer to FIG. 7) may have a circular shape or a polygonal shape in a plan view.

Referring to FIG. 2, the display panel DP may include a base layer BS, a circuit element layer DP-CL, a display element layer DP-OLED, a thin film encapsulation layer TFE, and a light control layer OSL. The circuit element layer DP-CL, the display element layer DP-OLED, the thin film encapsulation layer TFE, the light control layer OSL, and the window panel WD may be sequentially disposed on the base layer BS. The display panel DP may further include functional layers such as an anti-reflective layer, a refractive index control layer, or the like. The circuit element layer DP-CL may include at least two insulating layers and a circuit element. The insulating layers of the circuit element layer DP-CL may include an organic layer and/or an inorganic layer. Description of the insulating layers of the circuit element layer DP-CL is provided below.

The base layer BS may include a synthetic resin layer. The synthetic resin layer of the base layer BS may include a heat curable resin. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer BS may include a glass substrate, a metal substrate, or an organic/inorganic composite material substrate.

The circuit element layer DP-CL may include an insulating layer, a semiconductor layer, and a conductive layer, which are formed by a coating or depositing process. The insulating layer, the semiconductor layer, and the conductive layer of the circuit element layer DP-CL may be selectively patterned through several photolithography processes. Through the processes (e.g., the photolithography processes), a semiconductor pattern, a conductive pattern, and a signal line may be formed. Patterns disposed on a same layer may be formed through a same process.

The circuit element layer DP-CL may include a driving circuit and/or a signal line, which form the pixel (e.g., PX11 to PXnm of FIG. 3). The display element layer DP-OLED may include a light emitting element OLED (e.g., refer to FIG. 7) and a pixel definition layer PDL (e.g., refer to FIG. 7), which are included in the pixel.

The thin film encapsulation layer TFE may be disposed on the display element layer DP-OLED and may protect the light emitting element OLED. The thin film encapsulation layer TFE may include inorganic layers and an organic layer disposed between the inorganic layers. The inorganic layers of the thin film encapsulation layer TFE may protect the light emitting element OLED from moisture and oxygen, and the organic layer of the thin film encapsulation layer TFE may protect the light emitting element OLED from a foreign substance such as dust particles.

The light control layer OSL may include light control patterns that convert an optical property of a source light generated by the light emitting element. The light control patterns may include a quantum dot and may include color filter patterns that selectively transmit a light exiting through the light control patterns.

The window panel WD may be disposed on the display panel DP and may transmit the image provided from the display panel DP to the outside of the display panel DP. As shown in FIG. 1A, the display area DA may be distinguished from the non-display area NDA in the display surface DP-IS of the window panel WD. A boundary between the display area DA and the non-display area NDA may be defined by a bezel pattern disposed under the window panel WD and absorbing the light.

The window panel WD may include a base layer and functional layers disposed on the base layer. The functional layers of the window panel WD may include a protective layer, an anti-fingerprint layer, and the like. The base layer of the window panel WD may include at least one of glass, sapphire, and plastic.

FIG. 3 shows an arrangement relationship between signal lines SL1 to SLn and DL1 to DLm and pixels PX11 to PXnm, which are included in the display panel DP, in a plan view. The signal lines SL1 to SLn and DL1 to DLm may include scan lines SL1 to SLn and data lines DL1 to DLm.

The pixels PX11 to PXnm may be arranged in the display area DA. Each of the pixels PX11 to PXnm may be electrically connected to a corresponding scan line among the scan lines SL1 to SLn and a corresponding data line among the data lines DL1 to DLm. Each of the pixels PX11 to PXnm may include the pixel driving circuit and the light emitting element. More types of signal lines may be provided in the display panel DP according to a configuration of the pixel driving circuit.

A gate driving circuit GDC may be disposed in the non-display area NDA. The gate driving circuit GDC may be integrated in the display panel DP through an oxide silicon gate driver circuit (OSG) process or an amorphous silicon gate driver circuit (ASG) process.

FIG. 4 shows a circuit diagram of a pixel PXij of the pixels PX11 to PXnm as a representative example.

The pixel PXij may include a pixel circuit PC and the light emitting element OLED. The pixel circuit PC may include transistors T1 to T3 and a capacitor Cst.

The transistors T1 to T3 may be formed through a low temperature polycrystalline silicon (LTPS) process or a low temperature polycrystalline oxide (LTPO) process. Each of the transistors T1 to T3 may include one of a silicon semiconductor and an oxide semiconductor. The oxide semiconductor of each of the transistors T1 to T3 may include crystalline or amorphous oxide semiconductor, and the silicon semiconductor of each of the transistors T1 to T3 may include amorphous silicon or polycrystalline silicon. However, the disclosure is not limited thereto.

Hereinafter, each of first, second, and third transistors T1, T2, and T3 may be an N-type transistor. However, the disclosure is not limited thereto or thereby. According to an embodiment, each of the first to third transistors T1 to T3 may be a P-type transistor or the N-type transistor according to a signal applied thereto. A source and a drain of the P-type transistor may respectively correspond to a drain and a source of the N-type transistor.

FIG. 4 shows a circuit configuration in which the pixel PXij is electrically connected to an i-th scan line SCLi, an i-th sensing line SSLi, a j-th data line DLj, and a j-th initial line ILj as a representative example.

The pixel circuit PC may include the first transistor T1 (e.g., a driving transistor), the second transistor T2 (e.g., a switching transistor), the third transistor T3 (e.g., a sensing transistor), and the capacitor Cst. However, the pixel circuit PC may further include additional transistors and additional capacitors.

The light emitting element OLED may be an organic light emitting element, which includes an anode (or a first electrode) and a cathode (or a second electrode), or an inorganic light emitting element. The anode of the light emitting element OLED may receive a first voltage ELVDD via the first transistor T1, and the cathode of the light emitting element OLED may receive a second voltage ELVSS. The light emitting element OLED may emit the light in response to the first voltage ELVDD and the second voltage ELVSS.

The first transistor T1 may include a drain D1 receiving the first voltage ELVDD, a source S1 electrically connected to the anode of the light emitting element OLED, and a gate G1 electrically connected to the capacitor Cst. The first transistor T1 may control a driving current flowing from the first voltage ELVDD to the light emitting element OLED in response to a level of a voltage charged in the capacitor Cst.

The second transistor T2 may include a drain D2 electrically connected to the j-th data line DLj, a source S2 electrically connected to the capacitor Cst, and a gate G2 receiving an i-th first scan signal SCi. The second transistor T2 may apply a data voltage Vd to the first transistor T1 in response to the i-th first scan signal SCi.

The third transistor T3 may include a source S3 electrically connected to the j-th initial line ILj, a drain D3 electrically connected to the anode of the light emitting element OLED, and a gate G3 receiving an i-th second scan signal SSi. The j-th initial line ILj may receive an initial voltage Vintit.

Figure 5:
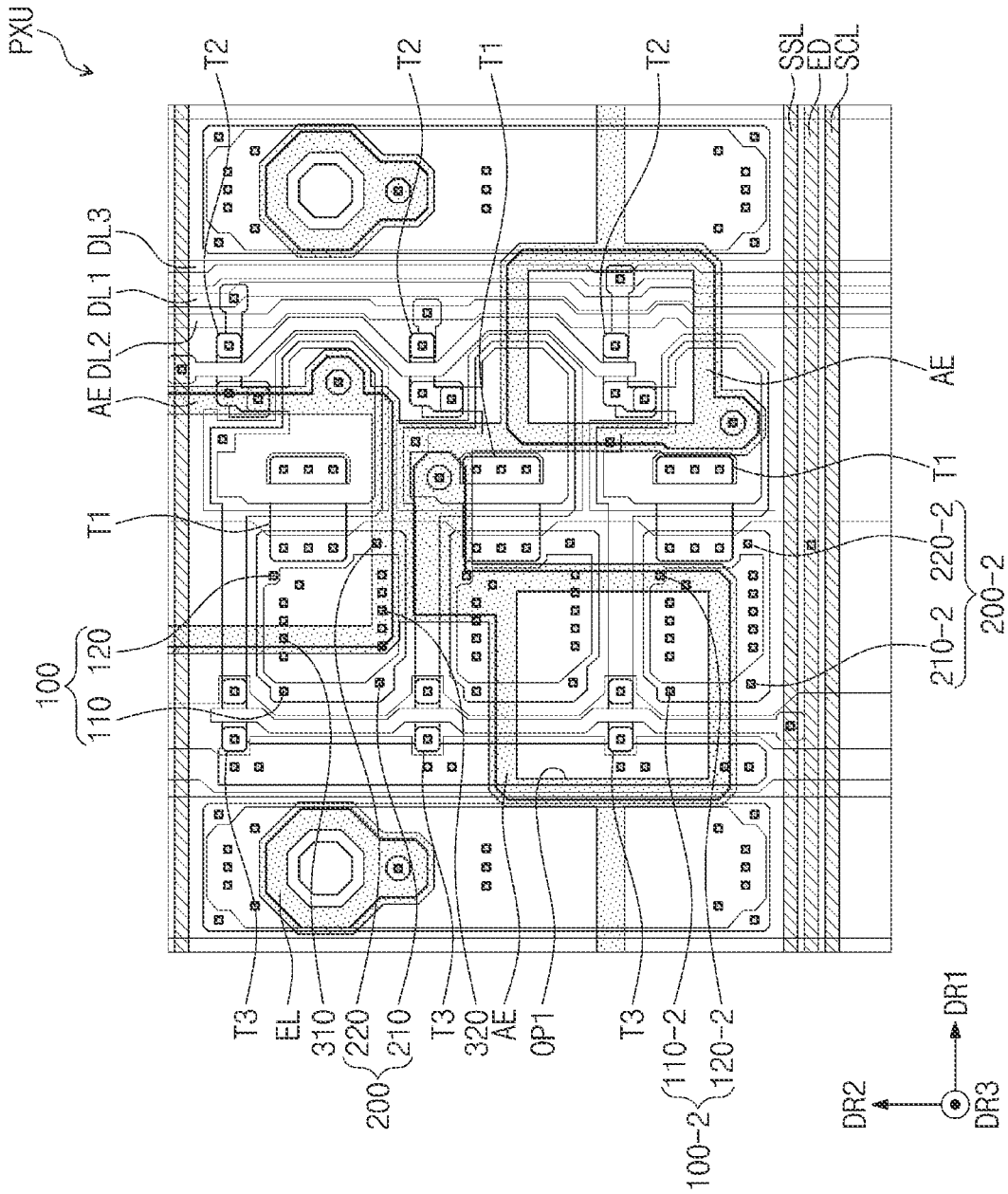
FIG. 5 is a schematic plan view of conductive patterns included in a pixel part based on a stack order according to an embodiment of the disclosure.

FIG. 5 is a schematic plan view of conductive patterns included in the pixel part based on a stack order according to an embodiment of the disclosure. FIGS. 6A to 6K are schematic plan views of the conductive patterns included in the pixel part for each layer based on the stack order according to an embodiment of the disclosure.

FIG. 5 shows an arrangement relationship of three pixels included in the pixel part PXU (e.g., refer to FIG. 1A) and components included in the driving element, and FIGS. 6A to 6K show components shown in FIG. 5 for each layer.

Each of the pixels may be electrically connected to a first power line ED, a second power line EL, a scan line SCL, and a sensing line SSL. The pixels may be electrically connected to corresponding data lines DL1, DL2, and DL3. The first power line ED may provide the first voltage ELVDD, and the second power line EL may provide the second voltage ELVSS (e.g., refer to FIG. 4) having a voltage level lower than that of the first voltage ELVDD.

Each of the pixels may include the first, second, and third transistors T1, T2, and T3, the capacitor Cst, and the light emitting element OLED (e.g., refer to FIG. 4). FIG. 5 shows the first electrode AE of light emitting elements OLED respectively included in the pixels.

An equivalent circuit of the first, second, and third transistors T1, T2, and T3 and the capacitor Cst, which are included in the pixels, may correspond to the circuit diagram described with reference to FIG. 4.

In FIGS. 6A to 6K, reference numerals of the components are shown only on the layer where the components are disposed, and when describing the components whose reference numerals are not shown, descriptions are made with reference to other figures where the components are disposed in FIGS. 6A to 6K.

Figure 6A:
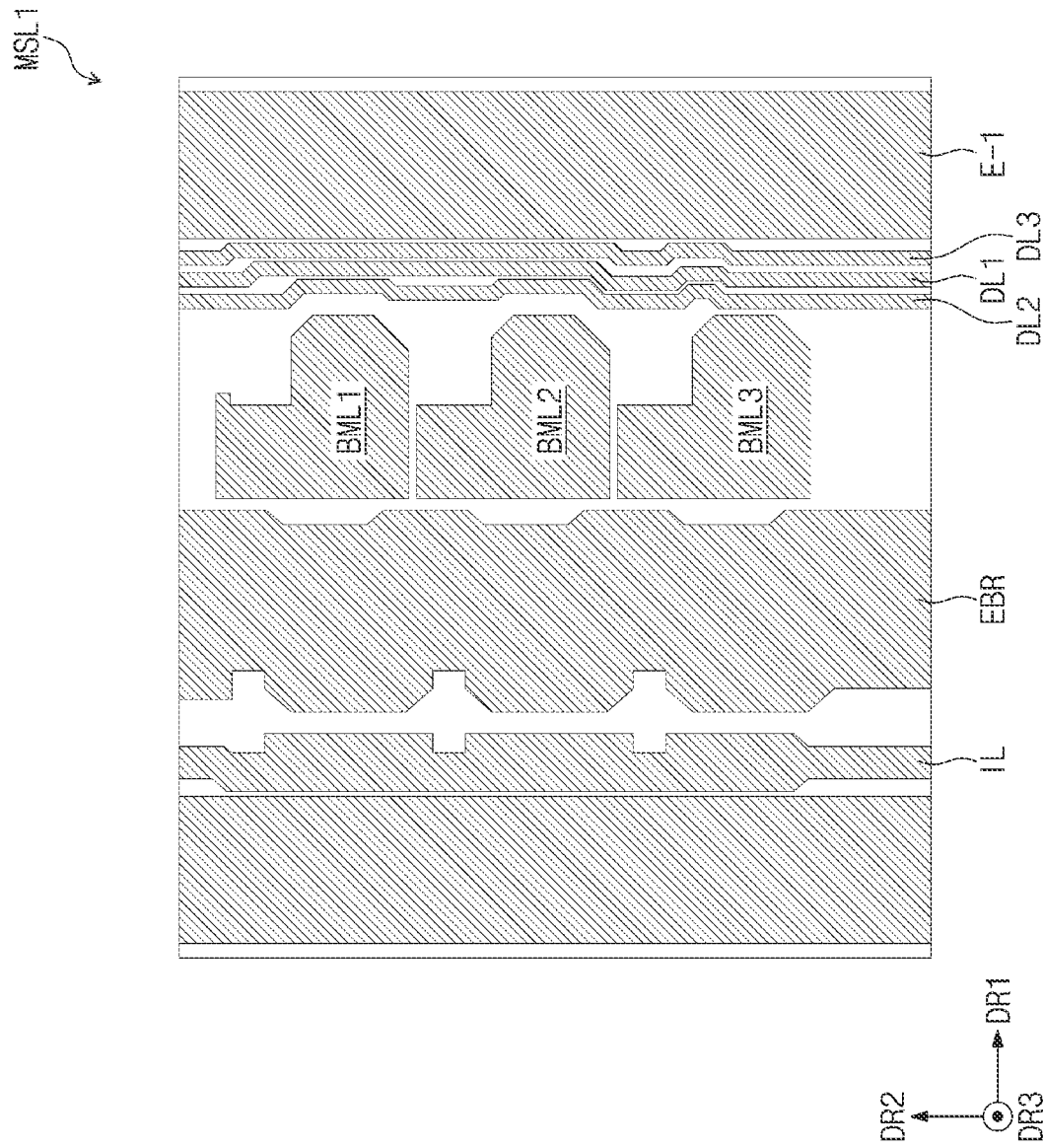

Referring to FIGS. 5 and 6A, a first conductive layer MSL1 may include an initial line IL, a power pattern EBR, light blocking patterns BML1, BML2, and BML3, the first, second, and third data lines DL1, DL2, and DL3, and a first line E-1 of the second power line EL.

The first, second, and third data lines DL1, DL2, and DL3 may be spaced apart from each other in the first direction DR1, and each of the first, second, and third data lines DL1, DL2, and DL3 may extend in the second direction DR2. FIGS. 5 and 6A to 6K show the second data line DL2, the first data line DL1, and the third data line DL3, which are sequentially arranged in the first direction DR1. However, the disclosure is not limited thereto or thereby. According to an embodiment, an arrangement order of the first, second, and third data lines DL1, DL2, and DL3 may be changed and is not limited thereto.

Each of the initial line IL and the power pattern EBR may extend in the second direction DR2, and the initial line IL and the power pattern EBR may be spaced apart from each other in the first direction DR1. The power pattern EBR may be electrically connected to a first power line ED of a fourth conductive layer MSL4 and may apply the first voltage ELVDD to the first transistor T1. Description of the fourth conductive layer MSL4 is provided below.

The first line E-1 disposed at a lowermost position of the second power line EL may extend in the second direction DR2. Accordingly, the first line E-1, the first, second, and third data lines DL1, DL2, and DL3, and the initial line IL may extend in a same direction (e.g., in the second direction DR2).

The light blocking patterns BML1, BML2, and BML3 may be disposed between the second data line DL2 and the power pattern EBR and may be spaced apart from each other in the second direction DR2. The light blocking patterns BML1, BML2, and BML3 may be individually provided to partially overlap the semiconductor layer of the first transistor T1 of corresponding pixels in a plan view. According to an embodiment, each of the light blocking patterns BML1, BML2, and BML3 may be electrically connected to the source S1 of the first transistor T1 overlapping thereto in a plan view and may receive a signal applied to the source S1 to form a sync structure under the semiconductor pattern.

The first conductive layer MSL1 may be covered by a first insulating layer 10. The first insulating layer 10 (e.g., refer to FIG. 6B) may be a buffer layer.

Figure 6B:
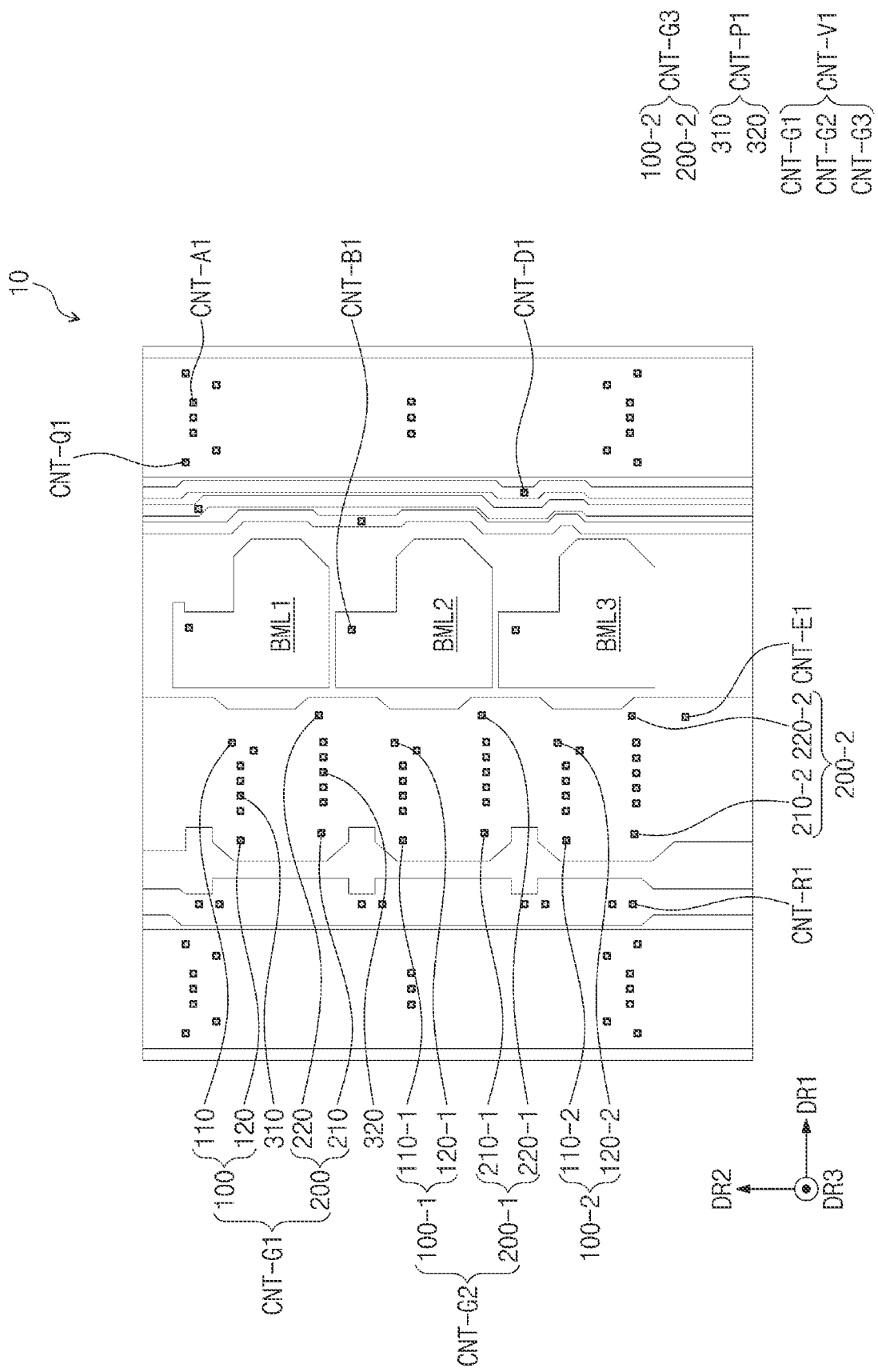

FIG. 6B shows contact holes formed through the first insulating layer. The first insulating layer 10 may be disposed on the base layer BS (e.g., refer to FIG. 2) and may cover the first conductive layer MSL1. The first insulating layer 10 may be provided with the contact holes defined therethrough and expose portions of the first conductive layer MSL1.

First initial contact holes CNT-R1 may expose portions of the initial line IL. First-first additional contact holes CNT-A1 and first-second additional contact holes CNT-Q1 may expose portions of the first line E-1.

First power contact holes CNT-P1 and second power contact holes CNT-V1 may expose portions of the power pattern EBR.

The first power contact holes CNT-P1 and the second power contact holes CNT-V1 may include holes. The power pattern EBR of the first conductive layer MSL1 may be electrically connected to other conductive layers via the first power contact holes CNT-P1 and the second power contact holes CNT-V1. As an example, the power pattern EBR may be electrically connected to a first additional power pattern ED-S1 (e.g., refer to FIG. 6E) via the first power contact holes CNT-P1. The power pattern EBR may be electrically connected to a second additional power pattern ED-S2 (e.g., refer to FIG. 6G) via the second power contact holes CNT-V1.

The second power contact holes CNT-V1 may be disposed at outer portions (e.g., outer portions of the power pattern EBR of FIG. 6A) than the first power contact holes CNT-P1.

The second power contact holes CNT-V1 may include contact hole groups. The contact hole groups of the second power contact holes CNT-V1 may include a first contact hole group CNT-G1, a second contact hole group CNT-G2, and a third contact hole group CNT-G3. The first contact hole group CNT-G1, the second contact hole group CNT-G2, and the third contact hole group CNT-G3 may be arranged in the second direction DR2.

The first contact hole group CNT-G1 may include first contact holes 100 and second contact holes 200. The second contact hole group CNT-G2 may include first contact holes 100-1 and second contact holes 200-1. The third contact hole group CNT-G3 may include first contact holes 100-2 and second contact holes 200-2. As an example, the first contact hole group CNT-G1 may include the first contact holes 100 disposed at an upper side in the second direction DR2 and the second contact holes 200 disposed at a lower side in the second direction DR2. The second contact hole group CNT-G2 may include the first contact holes 100-1 disposed at the upper side in the second direction DR2 and the second contact holes 200-1 disposed at the lower side in the second direction DR2. The third contact hole group CNT-G3 may include the first contact holes 100-2 disposed at the upper side in the second direction DR2 and the second contact holes 200-2 disposed at the lower side in the second direction DR2.

The number and the arrangement of the first contact holes 100, 100-1, and 100-2 respectively included in the first contact hole group CNT-G1, the second contact hole group CNT-G2, and the third contact hole group CNT-G3 may be the same as each other, and the number and the arrangement of the second contact holes 200, 200-1, and 200-2 respectively included in the first contact hole group CNT-G1, the second contact hole group CNT-G2, and the third contact hole group CNT-G3 may be the same as each other.

The first contact holes 100, 100-1, and 100-2 may respectively include first holes 110, 110-1, and 110-2 and may respectively include second holes 120, 120-1, and 120-2, which are respectively spaced apart from the first holes 110, 110-1, and 110-2 in the first direction DR1. For example, the first contact holes 100 of the first contact hole group CNT-G1 may include the first hole 110 and the second hole 120 spaced apart from each other in the first direction DR1. The first contact holes 100-1 of the second contact hole group CNT-G2 may include the first hole 110-1 and the second hole 120-1 spaced apart from each other in the first direction DR1. The first contact holes 100-2 of the third contact hole group CNT-G3 may include the first hole 110-2 and the second hole 120-2 spaced apart from each other in the first direction DR1. The second contact holes 200, 200-1, and 200-2 may respectively include third holes 210, 210-1, and 210-2 and may respectively include fourth holes 220, 220-1, and 220-2, which are respectively spaced apart from the third holes 210, 210-1, and 210-2 in the first direction DR1. For example, the second contact holes 200 of the first contact hole group CNT-G1 may include the third hole 210 and the fourth hole 220 spaced apart from each other in the first direction DR1. The second contact holes 200-1 of the second contact hole group CNT-G2 may include the third hole 210-1 and the fourth hole 220-1 spaced apart from each other in the first direction DR1. The second contact holes 200-2 of the third contact hole group CNT-G3 may include the third hole 210-2 and the fourth hole 220-2 spaced apart from each other in the first direction DR1.

Each of the first power contact holes CNT-P1 may include third contact holes 310 disposed at the upper side in the second direction DR2 and fourth contact holes 320 disposed at the lower side in the second direction DR2. According to an embodiment, the number of the third contact holes 310 may be the same as the number of the fourth contact holes 320.

The first power contact holes CNT-P1 and the second power contact holes CNT-V1 are described below.

Each of first data contact holes CNT-D1 may expose a portion of a corresponding data line among the first, second, and third data lines DL1, DL2, and DL3. Each of first light blocking contact holes CNT-B1 may expose a portion of a corresponding light blocking pattern among the light blocking patterns BML1, BML2, and BML3. A first line contact hole CNT-E1 may expose a portion of the power pattern EBR.

Figure 6C:
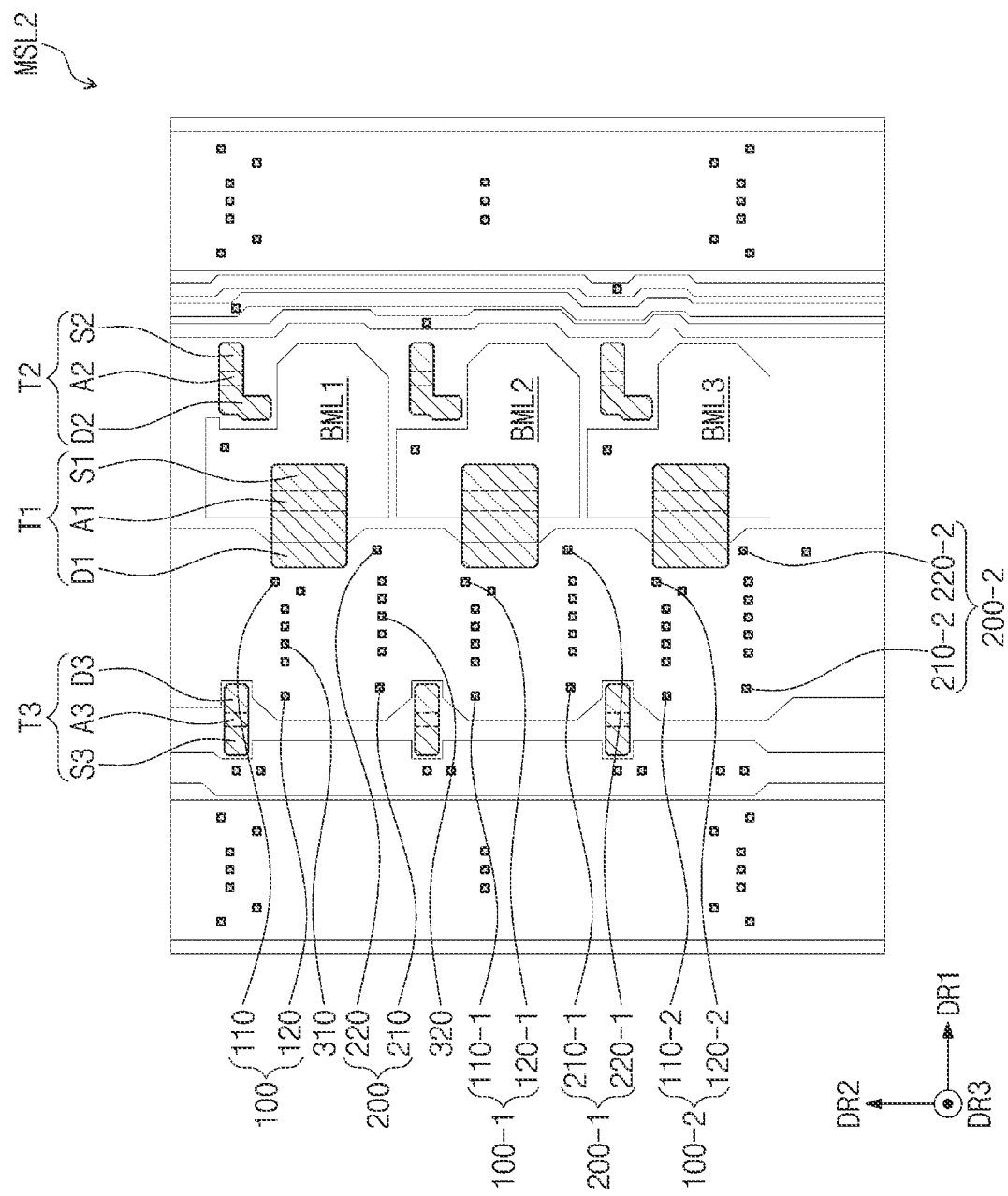

Referring to FIGS. 5 and 6C, a second conductive layer MSL2 may be disposed on the first insulating layer 10. The second conductive layer MSL2 may include semiconductor layers respectively included in the first, second, and third transistors T1, T2, and T3.

The semiconductor pattern included in the first transistor T1 may include the source S1, the drain D1, and a channel area A1. The channel area A1 of the first transistor T1 may be disposed between the source S1 and the drain D1. The semiconductor pattern included in the second transistor T2 may include the source S2, the drain D2, and a channel area A2. The channel area A2 of the second transistor T2 may be disposed between the source S2 and the drain D2. The semiconductor pattern included in the third transistor T3 may include the source S3, the drain D3, and a channel area A3. The channel area A3 of the third transistor T3 may be disposed between the source S3 and the drain D3.

Areas included in each of the semiconductor patterns may be divided into the source, the drain, and the channel area after a reduction process is performed using a gate, which is described below, as a mask.

Each of the semiconductor patterns may be formed as an oxide semiconductor pattern. As an example, an oxide semiconductor may include one of indium gallium zinc oxide (IGZO) and indium tin zinc oxide (ITZO). However, the disclosure is not limited thereto or thereby. According to an embodiment, the semiconductor patterns may include amorphous silicon or polycrystalline silicon. The disclosure is not limited thereto or thereby.

Figure 6D:
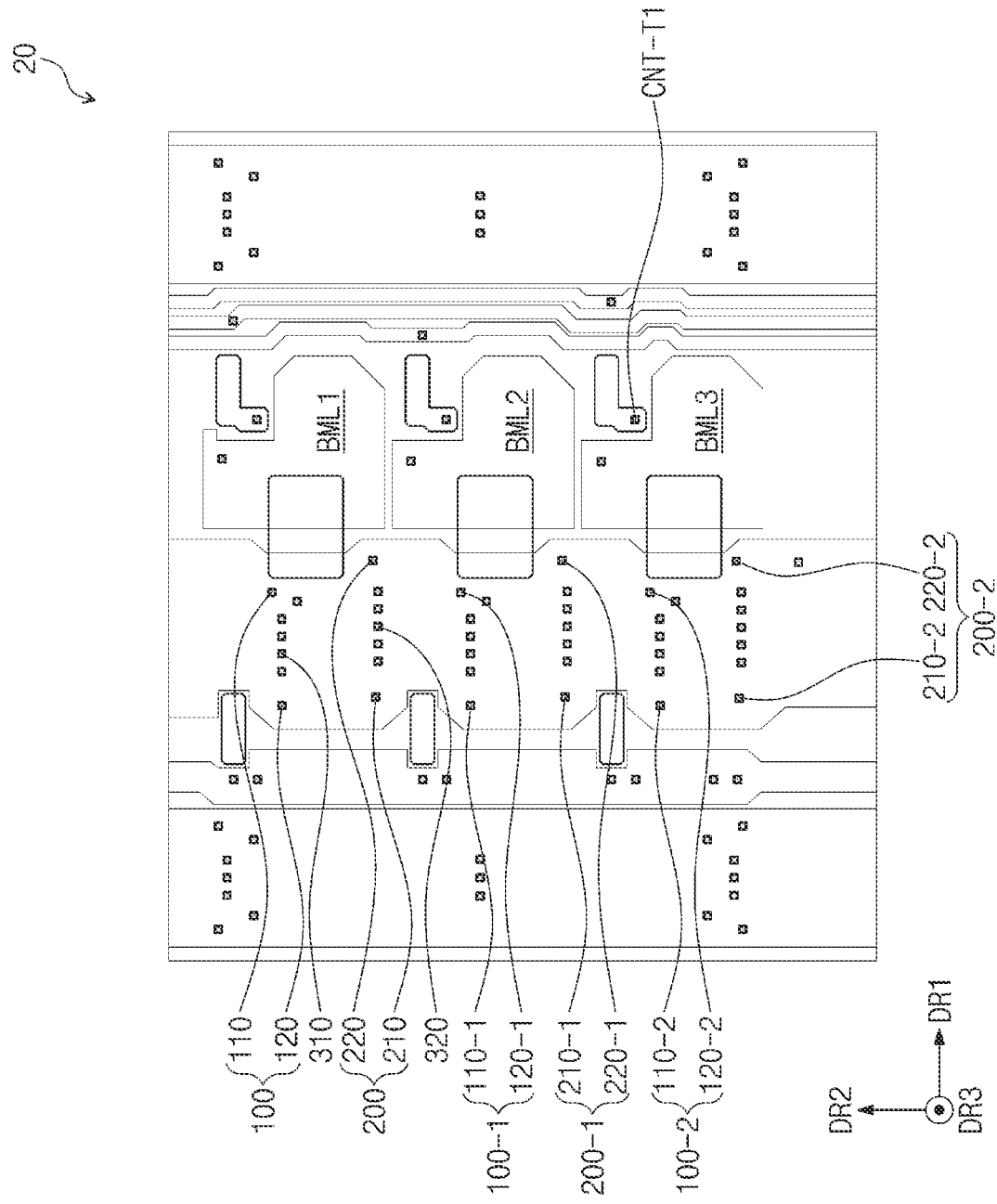

FIG. 6D shows contact holes formed through a second insulating layer 20. The second insulating layer 20 may be disposed on the first insulating layer 10 and may cover a portion of the second conductive layer MSL2 (e.g., refer to FIG. 6C). The second insulating layer 20 may be provided with the contact holes defined therethrough and expose portions of the second conductive layer MSL2.

A first gate contact hole CNT-T1 may overlap in a plan view a protruding portion PP (e.g., refer to FIG. 7) protruded from the drain D2 included in the second transistor T2.

Figure 6E:
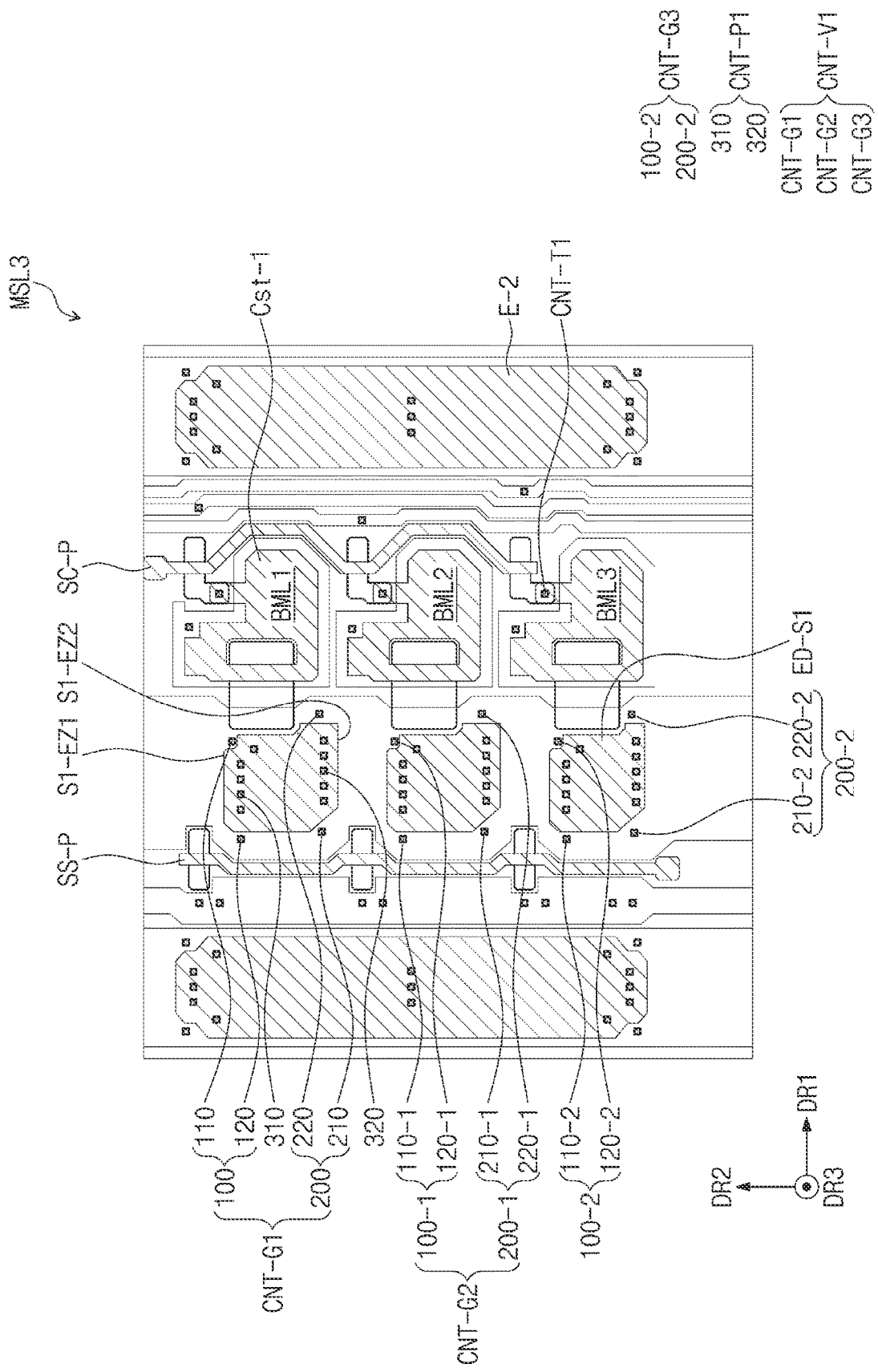

According to the disclosure, after the contact holes (e.g., the first gate contact hole CNT-T1) are formed through the second insulating layer 20, a conductive layer disposed on the second insulating layer 20 may be patterned to form a third conductive layer MSL3 (e.g., refer to FIG. 6E). The second insulating layer 20 may be removed by using conductive patterns formed on (or in) the third conductive layer MSL3 as a mask.

Accordingly, the second insulating layer 20 may have a shape corresponding to a shape of the conductive patterns included in the third conductive layer MSL3 except the contact holes formed through the second insulating layer 20 in a plan view. In the disclosure, the expression "a component X has a shape corresponding to a shape of a component Y" does not mean that the component X has a size that is the same as a size of the component Y in a plan view, and the difference between the sizes of the components may be caused by a process tolerance.

Referring to FIGS. 5 and 6E, the third conductive layer MSL3 may be disposed on the second insulating layer 20 (e.g., refer to FIG. 6D). The third conductive layer MSL3 may include a sensing pattern SS-P electrically connected to the sensing line SSL of the fourth conductive layer MSL4 (e.g., refer to FIG. 6G), a scan pattern SC-P electrically connected to the scan line SCL of the fourth conductive layer MSL4, an additional line E-2 of the second power line EL, and a first portion (or a first pattern) Cst-1 (e.g., refer to FIG. 7) of the capacitor Cst.

The third conductive layer MSL3 may include the first additional power pattern ED-S1. The first additional power pattern ED-S1 may be provided in each of the pixels. A portion of the first additional power pattern ED-S1, which overlaps the power pattern EBR in a plan view, may be disposed in the first power contact holes CNT-P1 and may be electrically connected to the power pattern EBR of the first conductive layer MSL1.

The first additional power pattern ED-S1 may be provided in plural. The first additional power patterns ED-S1 may be arranged in the second direction DR2. FIG. 6E shows three first additional power patterns ED-S1 arranged in the second direction DR2. All the first additional power patterns ED-S1 may overlap the power pattern EBR in a plan view. The first additional power patterns ED-S1 may be electrically connected to the power pattern EBR (e.g., refer to FIG. 6A) via the first power contact holes CNT-P1 defined through the insulating layers. For example, the first power contact holes CNT-P1 may be covered by the first additional power patterns ED-S1.

Each of the first additional power patterns ED-S1 may include a first upper edge S1-EZ1 and a first lower edge S1-EZ2. The third contact holes 310 of the first power contact holes CNT-P1 may be disposed adjacent to the first upper edge S1-EZ1, and the fourth contact holes 320 of the first power contact holes CNT-P1 may be disposed adjacent to the first lower edge S1-EZ2.

The second power contact holes CNT-V1 may not overlap the first additional power pattern ED-S1 in a plan view. The second power contact holes CNT-V1 may not be covered by the first additional power pattern ED-S1. The first contact holes 100, 100-1, and 100-2 and the second contact holes 200, 200-1, and 200-2 of the second power contact holes CNT-V1 may be disposed adjacent to an edge of the first additional power pattern ED-S1. The first contact holes 100, 100-1, and 100-2 may be adjacent to the first upper edge S1-EZ1, and the second contact holes 200, 200-1, and 200-2 may be adjacent to the first lower edge S1-EZ2. For example, the first holes 110, 110-1, and 110-2 may be spaced apart from the second holes 120, 120-1, and 120-2 with the first upper edge S1-EZ1 interposed therebetween. The third holes 210, 210-1, and 210-2 corresponding to the first holes 110, 110-1, and 110-2 may be spaced apart from the fourth holes 220, 220-1, and 220-2 corresponding to the second holes 120, 120-1, and 120-2 with the first lower edge S1-EZ2 interposed therebetween.

The additional line E-2 of the second power line EL may overlap the first line E-1 (e.g., refer to FIG. 6A) in a plan view. The additional line E-2 may be disposed on a different layer from the data lines DL1, DL2, and DL3. The additional line E-2 may extend in the second direction DR2. The first line E-1 and the additional line E-2 may be disposed spaced apart from the data lines DL1, DL2, and DL3 in a plan view. The additional line E-2 may be disposed in the first-first additional contact holes CNT-A1 (e.g., refer to FIG. 6B) and may be electrically connected to the first line E-1.

According to the disclosure, the third conductive layer MSL3 may include the gates included in the first, second, and third transistors T1, T2, and T3.

A portion of the third conductive layer MSL3, which overlaps the channel area A1 of the first transistor T1 in a plan view, may be defined as the gate G1 of the first transistor T1, and another portion of the third conductive layer MSL3 may be defined as the first portion Cst-1 of the capacitor Cst. The first portion Cst-1 may be disposed in the first gate contact hole CNT-T1 and may be electrically connected to the protruding portion PP (e.g., refer to FIG. 7) protruded from the drain D2 of the second transistor T2.

The scan pattern SC-P overlapping the channel area A2 of the second transistor T2 in a plan view may be defined as the gate G2 of the second transistor T2, and the sensing pattern SS-P of the channel area A3 of the third transistor T3 may be defined as the gate G3 of the third transistor T3.

The reduction process of the semiconductor patterns respectively included in the first, second, and third transistors T1, T2, and T3 may be performed using the gates G1, G2, and G3 as masks, and the source S1, S2, and S3 and the drain D1, D2, and D3 of each of the first, second, and third transistors T1, T2, and T3 may have a conductivity greater than that of the channel area A1, A2, and A3.

The sensing pattern SS-P may be formed in the third conductive layer MSL3 and may be electrically connected to the sensing line SSL formed in the fourth conductive layer MSL4 (e.g., refer to FIG. 6G) described below and extending in the first direction DR1. The sensing pattern SS-P may extend in the second direction DR2.

The scan pattern SC-P may be formed in the third conductive layer MSL3 and may be electrically connected to the scan line SCL formed in the fourth conductive layer MSL4 extending in the first direction DR1. The scan pattern SC-P may extend in the second direction DR2.

The third conductive layer MSL3 may be covered by a third insulating layer 30.

FIG. 6F shows contact holes formed through the third insulating layer 30. The third insulating layer 30 may be disposed on the second insulating layer 20 (e.g., refer to FIG. 6D). The third insulating layer 30 may cover at least a portion of the third conductive layer MSL3 (e.g., refer to FIG. 6E) disposed on the second insulating layer 20. The third insulating layer 30 may be provided with the contact holes defined therethrough and expose portions of the third conductive layer MSL3. For example, the third insulating layer 30 may have second initial contact holes CNT-R2, second-first additional contact holes CNT-A2, second-second additional contact holes CNT-Q2, a scan contact hole CNT-C, a sensing contact hole CNT-S, a second line contact hole CNT-E2, a second light blocking contact hole CNT-B2, additional first power contact holes CNT-P2, second-first semiconductor contact holes CNT-S21, second-second semiconductor contact holes CNT-S22, second-third semiconductor contact holes CNT-S23, a second gate contact hole CNT-T2, second data contact holes CNT-D2, or the like.

The second initial contact holes CNT-R2 may overlap the first initial contact holes CNT-R1 in a plan view.

The second-first additional contact holes CNT-A2 may expose portions of the additional line E-2. The second-second additional contact holes CNT-Q2 may expose portions of the first line E-1.

The scan contact hole CNT-C may expose a portion of the scan pattern SC-P. The sensing contact hole CNT-S may expose a portion of the sensing pattern SS-P.

The second line contact hole CNT-E2 may overlap the first line contact hole CNT-E1 in a plan view. The first line contact hole CNT-E1 and the second line contact hole CNT-E2 may expose a portion of the power pattern EBR.

The second-first additional contact holes CNT-A2 may overlap the first-first additional contact holes CNT-A1 in a plan view. The second-first additional contact holes CNT-A2 may expose portions of the additional line E-2.

The second-second additional contact holes CNT-Q2 may overlap the first-second additional contact holes CNT-Q1 in a plan view. The second-second additional contact holes CNT-Q2 may expose portions of the first line E-1.

The second light blocking contact hole CNT-B2 may overlap the first light blocking contact hole CNT-B1 in a plan view. The second light blocking contact hole CNT-B2 may expose corresponding light blocking patterns BML1, BML2, and BML3.

The additional first power contact holes CNT-P2 may overlap the first power contact holes CNT-P1 in a plan view. The additional first power contact holes CNT-P2 may expose corresponding first additional power patterns ED-S1. The additional first power contact holes CNT-P2 may be omitted.

The second power contact holes CNT-V1 may be defined through the third insulating layer 30. The second power contact holes CNT-V1 may expose portions of the power pattern EBR.

The second line contact hole CNT-E2 may overlap the first line contact hole CNT-E1 in a plan view. The second line contact hole CNT-E2 may expose a portion of the power pattern EBR.

The second-first semiconductor contact holes CNT-S21 may expose portions of the source S1 and the drain D1 of the first transistor T1.

The second-second semiconductor contact holes CNT-S22 may expose portions of the source S2 and the drain D2 of the second transistor T2.

The second-third semiconductor contact holes CNT-S23 may expose portions of the source S3 and the drain D3 of the third transistor T3.

The second gate contact hole CNT-T2 may expose a portion of the first portion Cst-1 of the capacitor Cst.

The second data contact holes CNT-D2 may overlap the first data contact holes CNT-D1 in a plan view. The second data contact holes CNT-D2 may expose portions of a corresponding data line among the first, second, and third data lines DL1, DL2, and DL3.

Figure 6G:
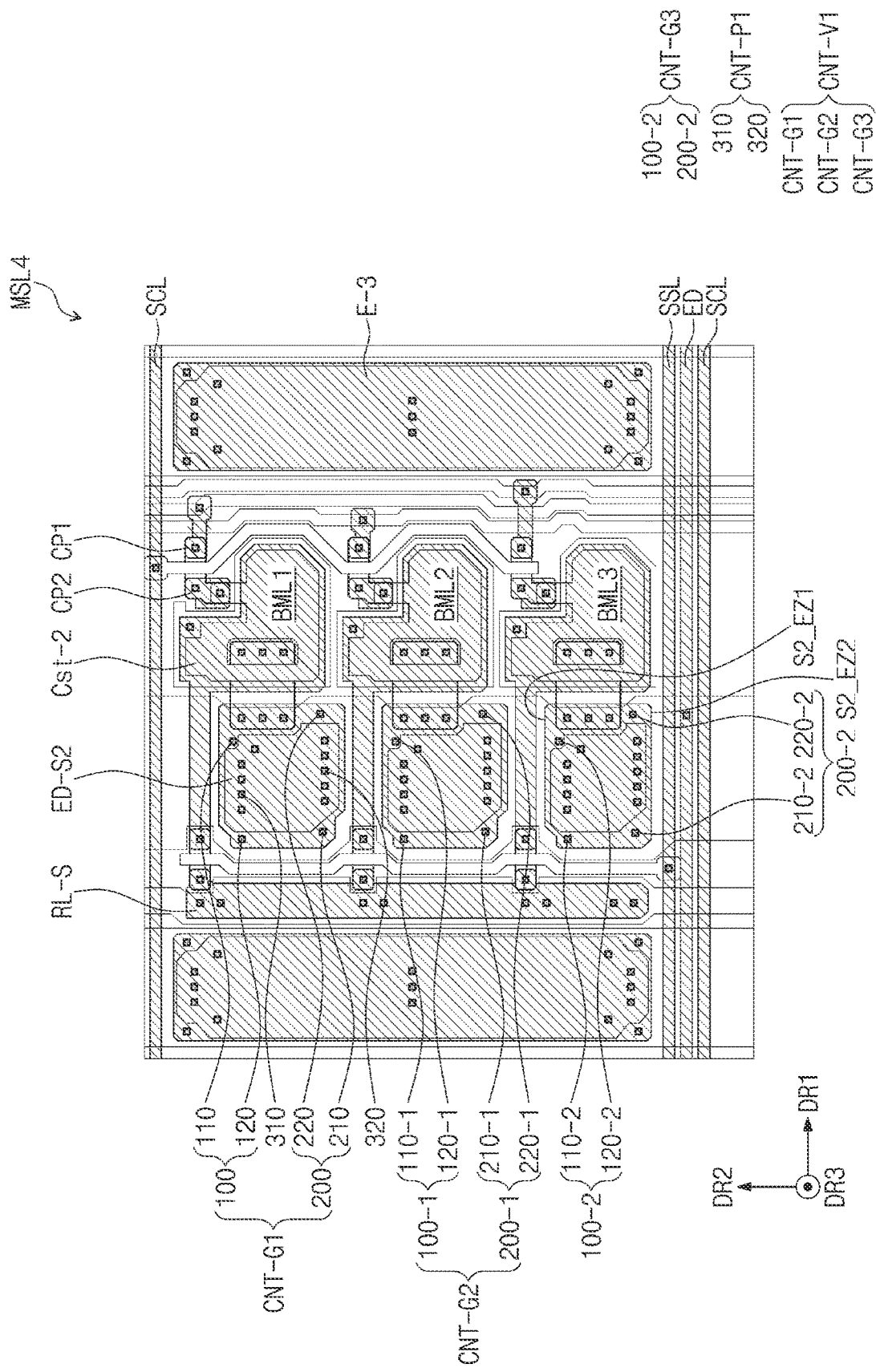

Referring to FIGS. 5 and 6G, the fourth conductive layer MSL4 may be disposed on the third insulating layer 30 (e.g., refer to FIG. 6F). The fourth conductive layer MSL4 may include the scan line SCL, the sensing line SSL, a second line E-3 of the first power line ED, a first sub-pattern CP1, a second sub-pattern CP2, a sub-initial line RL-S, and a second portion (or a second pattern) Cst-2 (e.g., refer to FIG. 6G) of the capacitor Cst. The fourth conductive layer MSL4 may be referred to as a second circuit conductive layer MSL4.

The fourth conductive layer MSL4 may include the second line E-3 of the second power line EL. The second line E-3 may overlap the first line E-1 (e.g., refer to FIG. 6A) and the additional line E-2 (e.g., refer to FIG. 6E) in a plan view and may extend in the second direction DR2.

The second line E-3 may be disposed in the second-first additional contact holes CNT-A2 (e.g., refer to FIG. 6F) and may be electrically connected to the additional line E-2. The second line E-3 may be electrically connected to the first line E-1 via the first-second additional contact holes CNT-Q1 and the second-second additional contact holes CNT-Q2.

The scan line SCL may be electrically connected to the scan pattern SC-P (e.g., refer to FIG. 6E) via the scan contact hole CNT-C (e.g., refer to FIG. 6F). For the convenience of explanation, FIG. 6G shows a structure in which the scan line SCL disposed at the upper side is connected to the scan pattern SC-P via the scan contact hole CNT-C, and a structure in which the scan line SCL disposed at the lower side overlaps the scan pattern SC-P is omitted. However, a connection between the scan line SCL disposed at the lower side and the scan pattern SC-P and a connection between the scan line SCL disposed at the upper side and the scan pattern SC-P may have a same structure.

The sensing line SSL may be electrically connected to the sensing pattern SS-P via the sensing contact hole CNT-S.

Each of the scan line SCL, the sensing line SSL, and the first power line ED may extend in the first direction DR1, and the scan line SCL, the sensing line SSL, and the first power line ED may be spaced apart from each other in the second direction DR2.

The fourth conductive layer MSL4 may include the second additional power pattern ED-S2. The second additional power pattern ED-S2 may be provided in plural, and the second additional power patterns ED-S2 may be disposed on the first additional power patterns ED-S1, respectively. According to an embodiment, the second additional power pattern ED-S2 may be disposed in the additional first power contact holes CNT-P2 and may be electrically connected to the first additional power pattern ED-S1.

In the embodiment, the second additional power pattern ED-S2 may be disposed on the second power contact holes CNT-V1 and may be electrically connected to the power pattern EBR (e.g., refer to FIG. 6A) via the second power contact holes CNT-V1. The second power contact holes CNT-V1 may be defined through the first, second, and third insulating layers 10, 20, and 30 and expose the power pattern EBR to the second additional power pattern ED-S2. For example, the first conductive layer MSL1 may be electrically connected to the fourth conductive layer MSL4 via the second power contact holes CNT-V1. At least one of the first, second, and third insulating layers 10, 20, and 30 may be referred to as a first circuit insulating layer 10, 20, and 30.

For example, the power pattern EBR of the first conductive layer MSL1 may be electrically connected to the second additional power pattern ED-S2 via the first contact holes 100, 100-1, and 100-2 and the second contact holes 200, 200-1, and 200-2.

The second additional power patterns ED-S2 may be arranged in the second direction DR2. Each of the second additional power patterns ED-S2 may cover a corresponding contact hole group among the contact hole groups CNT-G1, CNT-G2, and CNT-G3. For example, each of the second additional power patterns ED-S2 may be electrically connected to the power pattern EBR via the corresponding contact hole group among the contact hole groups CNT-G1, CNT-G2, and CNT-G3.

Each of the second additional power patterns ED-S2 may include a second upper edge S2-EZ1 defined at an upper side in the second direction DR2 and a second lower edge S2-EZ2 defined at a lower side in the second direction DR2. The first contact holes 100, 100-1, and 100-2 may be defined (or disposed) adjacent to the second upper edge S2-EZ1. The second contact holes 200, 200-1, and 200-2 may be defined (or disposed) adjacent to the second lower edge 52-EZ2. The number of the first contact holes 100, 100-1, and 100-2 may be the same as the number of the second contact holes 200, 200-1, and 200-2. Detailed descriptions of the second additional power patterns ED-S2 are provided below with reference to FIGS. 8 to 10B.

A portion of the second portion Cst-2 of the capacitor Cst may be disposed in the first light blocking contact hole CNT-B1 and the second light blocking contact hole CNT-B2 and may be electrically connected to each of the light blocking patterns BML1, BML2, and BML3.

A portion of the second portion Cst-2 of the capacitor Cst may be disposed in a contact hole, which overlaps the source S1 of the first transistor T1 in a plan view, among the second-first semiconductor contact holes CNT-S21 and may be electrically connected to the source S1 of the first transistor T1.

A portion of the second portion Cst-2 of the capacitor Cst may extend to the drain D3 of the third transistor T3. The second portion Cst-2 may be disposed in a contact hole, which overlaps the drain D3 in a plan view, among the second-third semiconductor contact hole CNT-S23 and may electrically connect the first transistor T1 to the third transistor T3.

The first sub-pattern CP1 may electrically connect the second transistor T2 to a corresponding data line among the data lines DL1, DL2, and DL3.

One end of the first sub-pattern CP1 may overlap the source S2 of the second transistor T2 in a plan view and may be disposed in a contact hole, which overlaps the source S2 of the second transistor T2 in a plan view, among the second-second semiconductor contact hole CNT-S22 (e.g., refer to FIG. 6F). Another end of the first sub-pattern CP1 may extend to a corresponding data line, may be disposed in the first data contact hole CNT-D1 and the second data contact hole CNT-D2, and may be electrically connected to the corresponding data line. Accordingly, the second transistor T2 and the data line may be electrically connected to each other via the first sub-pattern CP1.

One end of the second sub-pattern CP2 may overlap the drain D2 of the second transistor T2 in a plan view and may be disposed in a contact hole, which overlaps the drain D2 of the second transistor T2 in a plan view, among the second-second semiconductor contact hole CNT-522. Another end of the second sub-pattern CP2 may overlap the first portion Cst-1 of the capacitor Cst in a plan view and may be disposed in the second gate contact hole CNT-T2.

The sub-initial line RL-S may overlap the initial line IL in a plan view. The sub-initial line RL-S may be electrically connected to the initial line IL via the first and second initial contact holes CNT-R1 and CNT-R2.

In the embodiment, the conductive patterns included in the fourth conductive layer MSL4 may be provided in multiple layers. As an example, the fourth conductive layer MSL4 may be a metal layer having a double layer structure of titanium (Ti)/copper (Cu) or a metal layer having a triple layer structure of titanium (Ti)/aluminum (Al)/titanium (Ti).

Figure 6H:
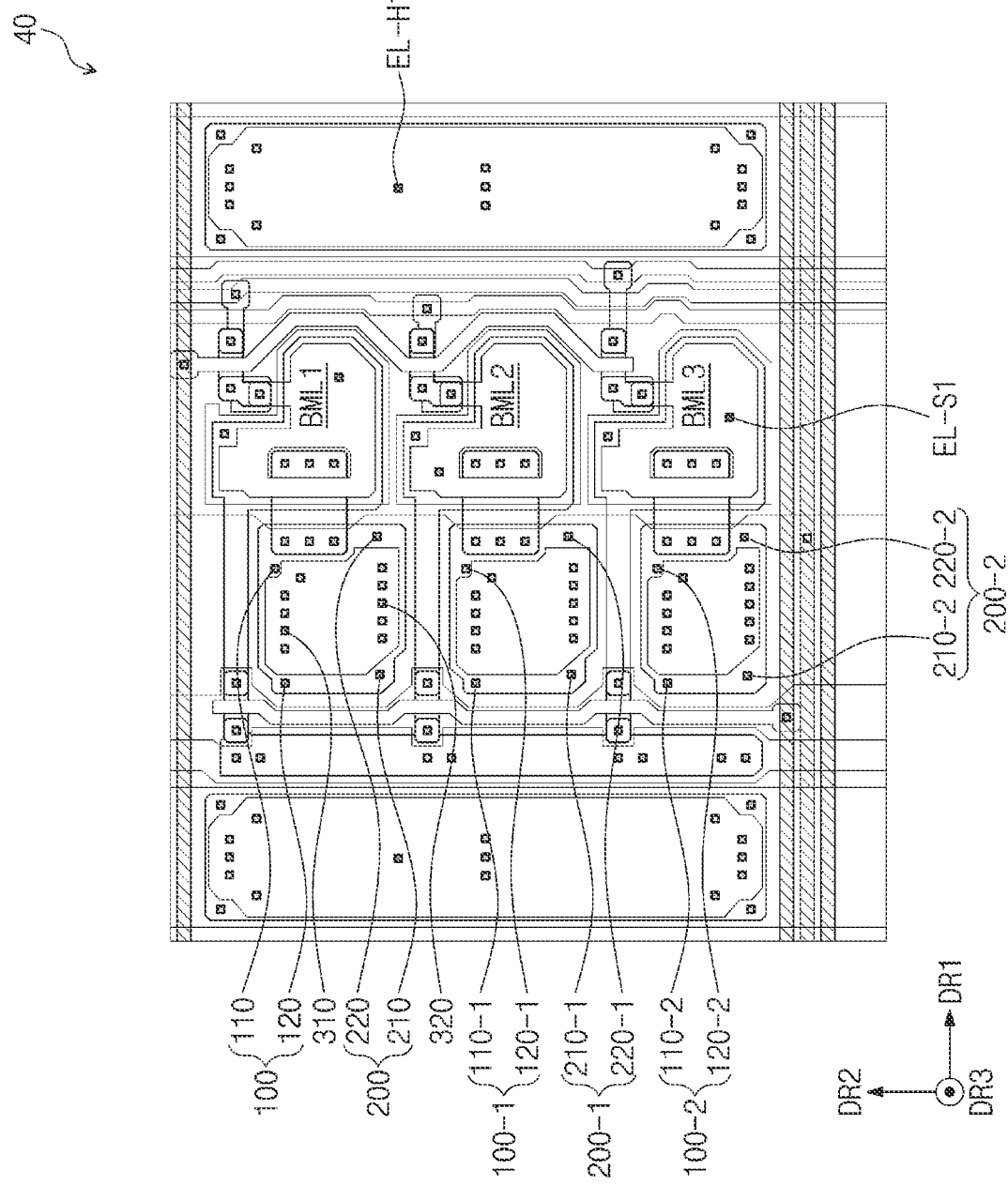
Figure 61:
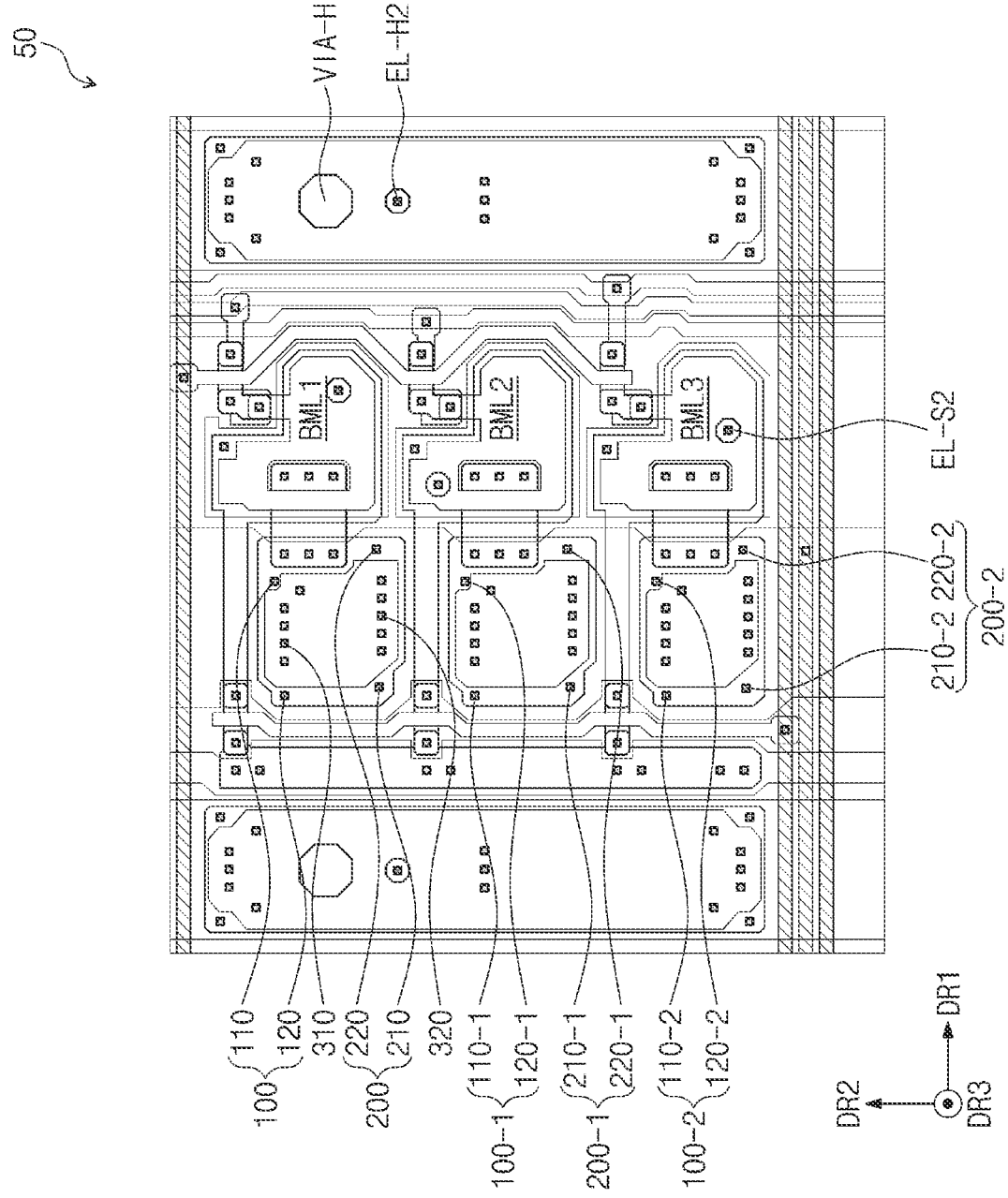

FIG. 6H shows contact holes defined through a fourth insulating layer 40. The fourth insulating layer 40 may be disposed on the third insulating layer 30 (e.g., refer to FIG. 6F). The fourth insulating layer 40 may cover at least a portion of the fourth conductive layer MSL4 (e.g., refer to FIG. 6G) disposed on the third insulating layer 30. The fourth insulating layer 40 may be provided with the contact holes defined therethrough and expose portions of the fourth conductive layer MSL4.

A first via contact hole EL-H1 may expose a portion of the second line E-3 of the first power line ED.

A first anode contact hole EL-S1 may expose a portion of the second portion Cst-2 of the capacitor Cst.

FIG. 6I shows contact holes defined through a fifth insulating layer 50. The fifth insulating layer 50 may be disposed on the fourth insulating layer 40 (e.g., refer to FIG. 6H). The fifth insulating layer 50 may be provided with the contact holes defined therethrough and overlap the contact holes defined through the fourth insulating layer 40 in a plan view.

A second via contact hole EL-H2 may overlap the first via contact hole EL-H1 (e.g., refer to FIG. 6H) in a plan view. The second via contact hole EL-H2 may have a size greater than a size of the first via contact hole EL-H1. The first via contact hole EL-H1 and the second via contact hole EL-H2 may expose a portion of the second line E-3 of the first power line ED (e.g., refer to FIG. 6G).

A second anode contact hole EL-S2 may overlap the first anode contact hole EL-S1 in a plan view. The first anode contact hole EL-S1 (e.g., refer to FIG. 6H) and the second anode contact hole EL-S2 may expose a portion of the second portion Cst-2 (e.g., refer to FIG. 6G) of the capacitor Cst.

A via hole VIA-H may overlap a portion of the second line E-3 of the first power line ED in a plan view. The first electrode AE of the light emitting element OLED (e.g., refer to FIG. 4) may be electrically connected to the second electrode CE (e.g., refer to FIG. 7) via the hole VIA-H.

According to an embodiment, one of the fourth insulating layer 40 and the fifth insulating layer 50 may be omitted. In this case, an insulating layer may be employed instead of the fourth insulating layer 40 and the fifth insulating layer 50. Thus, the contact holes defined through the fourth insulating layer 40 and the contact holes defined through the fifth insulating layer 50 may be defined through the insulating layer. However, the disclosure is not limited thereto.

Figure 6J:
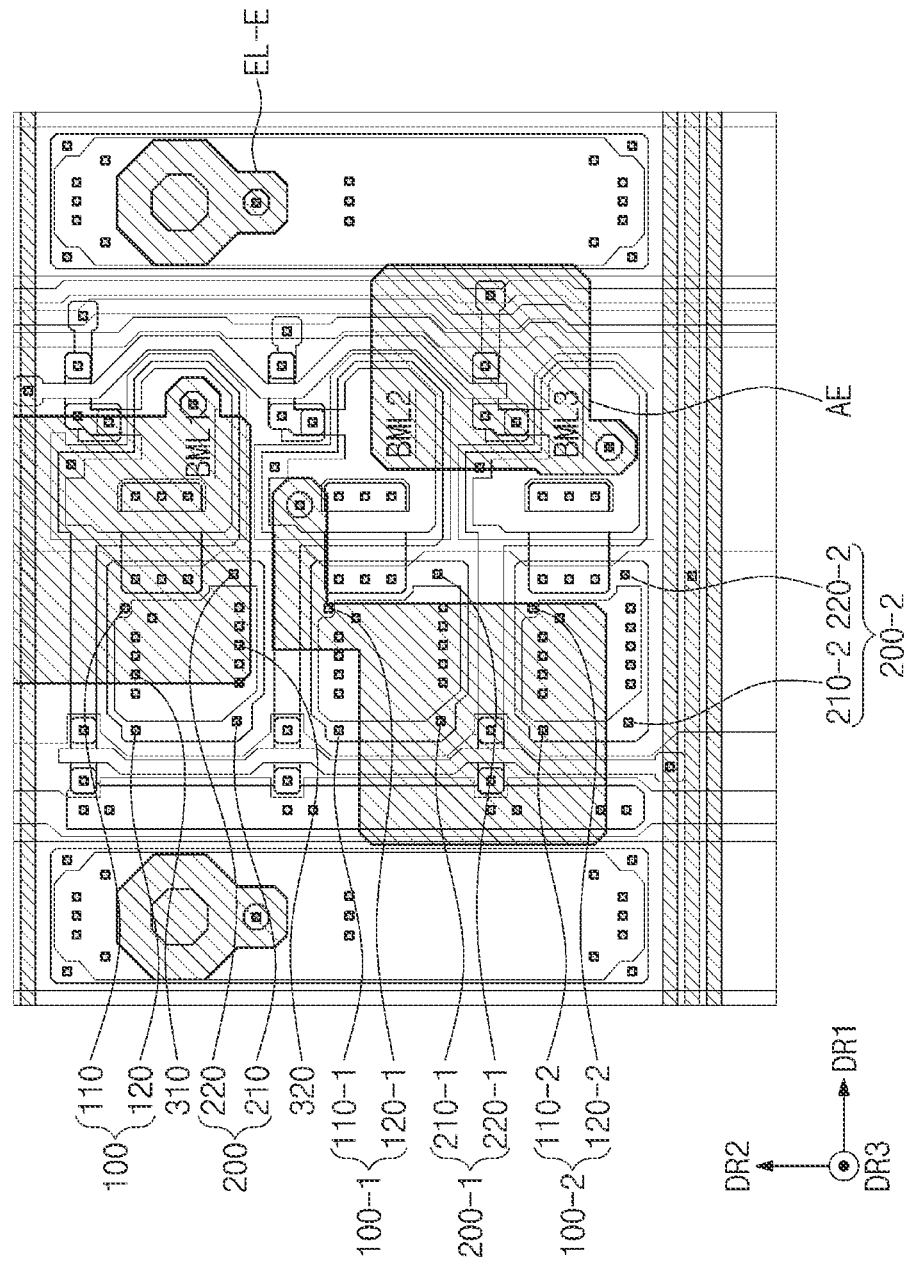

FIG. 6J shows the first electrode AE, which is included in the light emitting element OLED (refer to FIG. 4) of each of the pixels, and an electrode pattern EL-E. The first electrodes AE and the electrode pattern EL-E may be disposed on the fifth insulating layer 50 (e.g., refer to FIG. 6I).

The first electrode AE may be disposed in the first anode contact hole EL-S1 and the second anode contact hole EL-S2 and may be electrically connected to the second portion Cst-2 of the capacitor Cst.

The first electrode AE included in each of the pixels emitting different lights may have different sizes from each other. As an example, the size of the first electrode AE included in the pixel emitting a second color light may be smaller than a size of the first electrode AE included in the pixel emitting a first color light and may be greater than a size of the first electrode AE included in the pixel emitting a third color light. First, second, and third colors may be blue, red, and green colors, respectively.

However, the disclosure is not limited thereto or thereby. According to an embodiment, the first electrodes AE may have substantially a same size. The color of the light provided according to the size of the first electrode AE may be changed depending on a quality of the pixel. The disclosure is not limited thereto.

The electrode pattern EL-E may be disposed in the first via contact hole EL-H1 and the second via contact hole EL-H2 and may be electrically connected to the second line E-3 of the first power line ED.

Figure 6K:
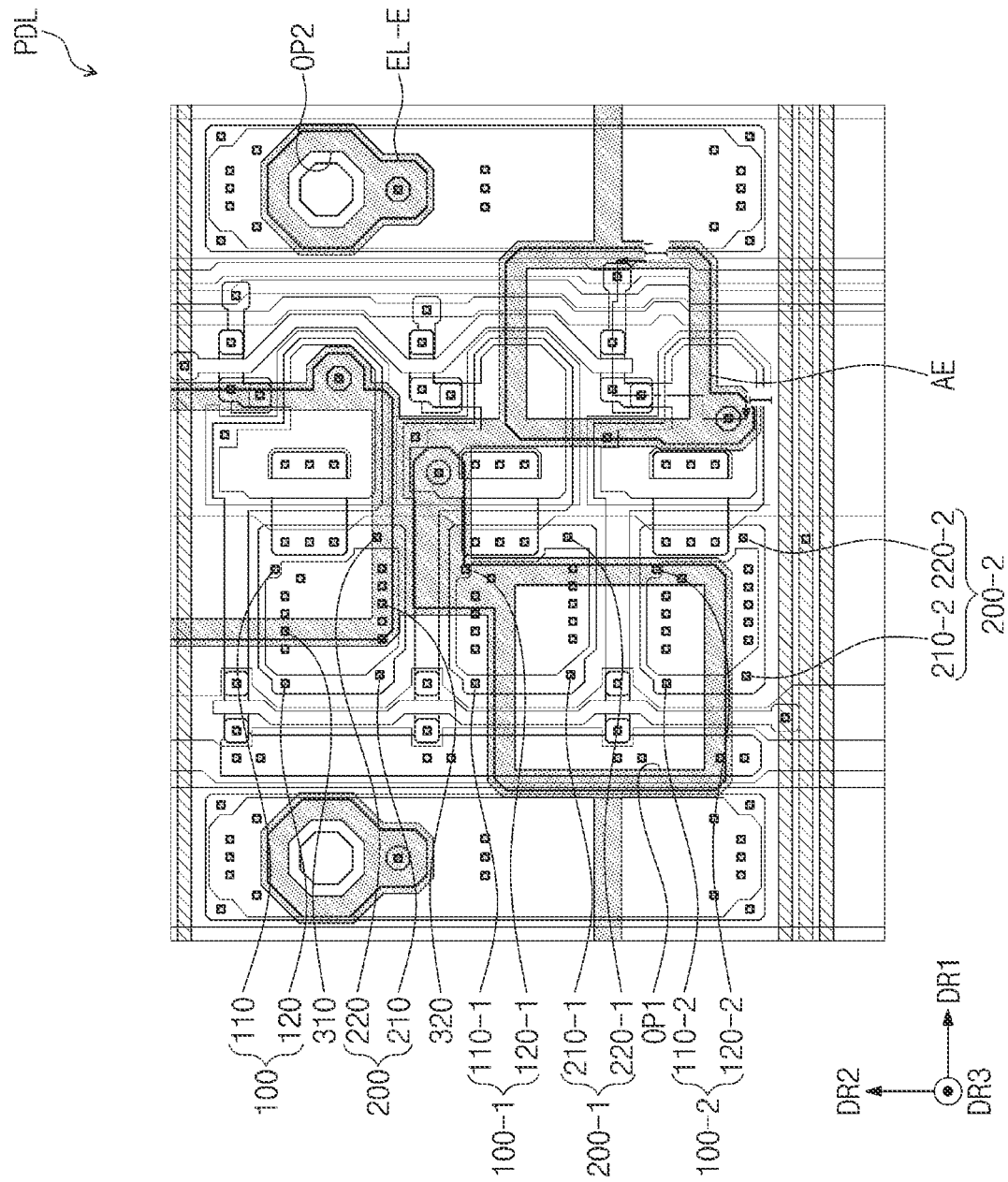

FIG. 6K shows the pixel definition layer PDL. The pixel definition layer PDL may be disposed on the fifth insulating layer 50 (e.g., refer to FIG. 6I) and may be provided with a first opening OP1 defined therethrough and a second opening OP2 defined therethrough. The first opening OP1 may expose at least a portion of the first electrode AE, and the second opening OP2 may expose at least a portion of the electrode pattern EL-E.

The pixel definition layer PDL may be patterned to be adjacent to (e.g., may be patterned to surround) an edge of the first electrode AE and an edge of the electrode pattern EL-E. The pixel definition layer PDL may cover the light blocking material.

Figure 7:
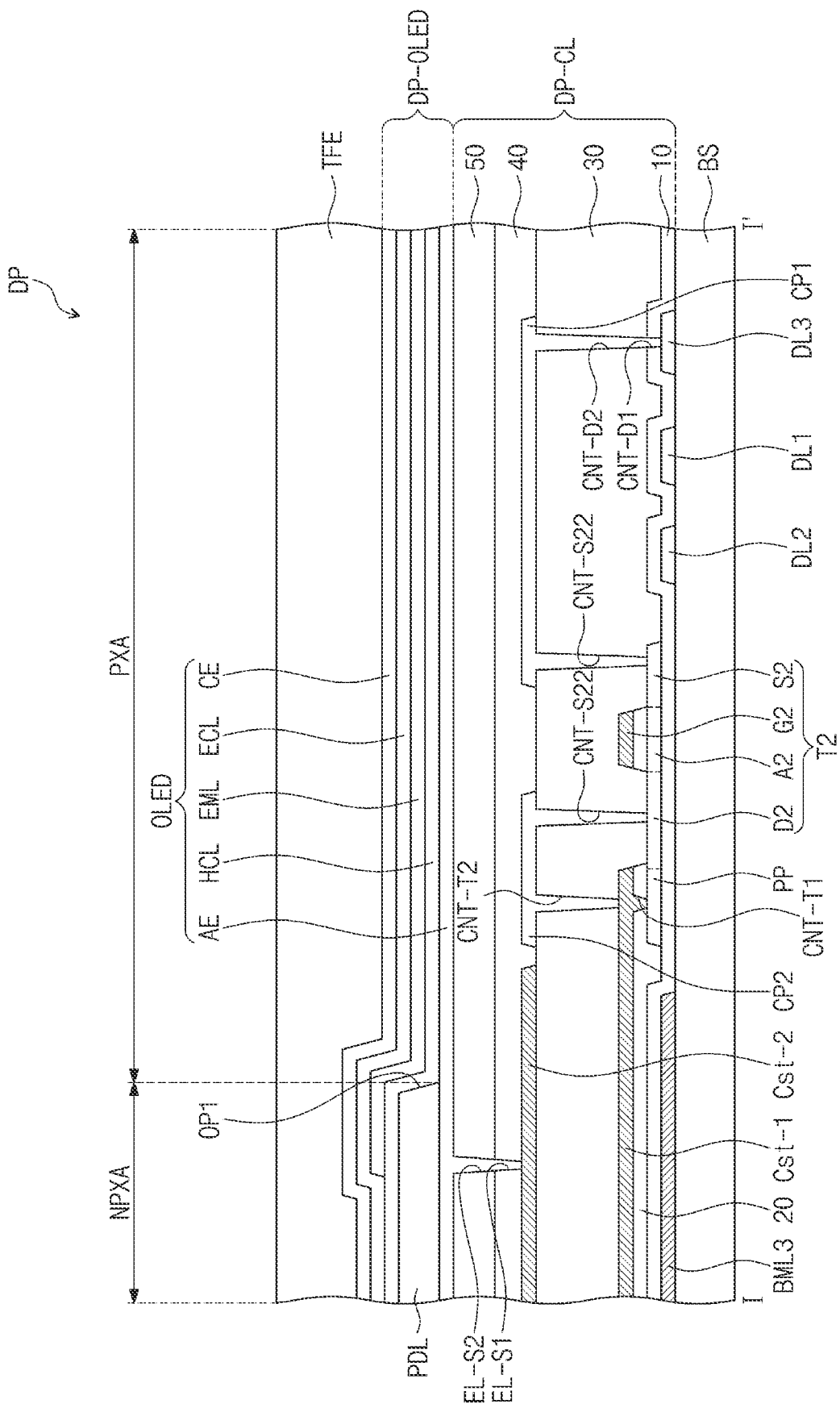
FIG. 7 is a schematic cross-sectional view taken along a line I-I' of FIG. 6K.

An area of the first electrode AE, which is exposed through the first opening OP1, may be defined as a light emitting area PXA (e.g., refer to FIG. 7) to which the light generated by the light emitting element OLED is provided, and an area overlapping the pixel definition layer PDL in a plan view may be defined as a non-light-emitting area NPXA (e.g., refer to FIG. 7).

FIG. 7 is a schematic cross-sectional view taken along a line I-I' of FIG. 6K. Referring to FIG. 7, the display panel DP may include the base layer BS, the circuit element layer DP-CL, the display element layer DP-OLED, and the thin film encapsulation layer TFE. The circuit element layer DP-CL, the display element layer DP-OLED, and the thin film encapsulation layer TFE may be disposed on the base layer B S. In FIG. 7, the window panel WD and the light control layer OSL, which are described with reference to FIG. 2, are not illustrated.

The circuit element layer DP-CL may include the first, second, third, fourth, and fifth insulating layers 10, 20, 30, 40, and 50 and the first, second, third, and fourth conductive layers MSL1, MSL2, MSL3, and MSL4. According to an embodiment, the first to fifth insulating layers 10 to 50 may include an inorganic layer or an organic layer.

The first to fifth insulating layers 10 to 50 and the pixel definition layer PDL may correspond to the insulating layers described with reference to FIGS. 6B, 6D, 6F, 6H, 6I, and 6K, and the first to fourth conductive layers MSL1 to MSL4 may correspond to the conductive layers described with reference to FIGS. 6A, 6C, 6E, and 6G.

The display element layer DP-OLED may include the light emitting element OLED and the pixel definition layer PDL. The light emitting element OLED may include the first electrode AE, a hole control layer HCL, the light emitting layer EML, an electron control layer ECL, and the second electrode CE.

The first electrode AE of the light emitting element OLED may be disposed on the fifth insulating layer 50. The first electrode AE may be the anode. The first electrode AE included in each of the pixels may correspond to the first electrode AE described with reference to FIG. 6J.

The pixel definition layer PDL may be disposed on the fifth insulating layer 50. At least a portion of the first electrode AE may be exposed via the first opening OP1 of the pixel definition layer PDL. The first opening OP1 of the pixel definition layer PDL may be defined as the light emitting area PXA to which the light is substantially provided. A periphery of the light emitting area PXA may be defined as the non-light-emitting area NPXA. For example, the non-light-emitting area NPXA may be adjacent to the light emitting area PXA and may not overlap the light emitting area PXA in a plan view.

The hole control layer HCL may be commonly disposed over the light emitting area PXA and the non-light-emitting area NPXA. A common layer such as the hole control layer HCL may be commonly formed in plural (or multiple) pixels. The hole control layer HCL may include a hole transport layer and a hole injection layer.

The light emitting layer EML may be disposed on the hole control layer HCL. The light emitting layer EML may be disposed only in an area corresponding to the first opening OP1. The light emitting layer EML may be disposed in the plural pixels after being divided into plural (or multiple) portions.

In the embodiment, the light emitting layer EML may be patterned in each of the plural pixels as a representative example. However, the light emitting layer EML may be commonly disposed over the plural pixels. The light emitting layer EML may be commonly disposed and generate a white light or a blue light. The light emitting layer EML may have a multi-layer structure.

The electron control layer ECL may be disposed on the light emitting layer EML. The electron control layer ECL may include an electron transport layer and an electron injection layer. The second electrode CE may be disposed on the electron control layer ECL. The electron control layer ECL and the second electrode CE may be commonly disposed over the plural pixels.

The thin film encapsulation layer TFE may be disposed on the second electrode CE. The thin film encapsulation layer TFE may be commonly disposed over the plural pixels. In the embodiment, the thin film encapsulation layer TFE may cover (e.g., directly cover) the second electrode CE.

The thin film encapsulation layer TFE may include at least one inorganic layer and at least one organic layer. As an example, the thin film encapsulation layer TFE may include two inorganic layers and the organic layer disposed between the two inorganic layers.

The inorganic layers of the thin film encapsulation layer TFE may include at least one of a silicon nitride layer, a silicon oxynitride layer, a silicon oxide layer, a titanium oxide layer, and an aluminum oxide layer. The organic layer of the thin film encapsulation layer TFE may include an acrylic-based organic layer. However, the disclosure is not limited thereto or thereby.

The light blocking pattern BML3 and the data lines DL1, DL2, and DL3 may be disposed on the base layer BS and may be covered by the first insulating layer 10.

The first insulating layer 10 may be disposed on the base layer BS and may cover the light blocking pattern BML3 and the data lines DL1, DL2, and DL3. The first insulating layer 10 may be provided with the first data contact hole CNT-D1 defined therethrough and expose a portion of the data lines DL1, DL2, and DL3.

The source S2, the channel area A2, and the drain D2 of the second transistor T2 and the protruding portion PP protruded from the drain D2 may be disposed on the first insulating layer 10.

The second insulating layer 20 may overlap the protruding portion PP and the channel area A2 in a plan view. The first gate contact hole CNT-T1 may be defined through a portion of the second insulating layer 20, which overlaps the protruding portion PP in a plan view. The first gate contact hole CNT-T1 may expose the portion of the protruding portion PP.

The gate G2 of the second transistor T2 may be disposed in an area of the second insulating layer 20, which overlaps the channel area A2 in a plan view.

The first portion Cst-1 of the capacitor Cst may be disposed on the second insulating layer 20 and may be electrically connected to the protruding portion PP via the first gate contact hole CNT-T1.

The third insulating layer 30 may cover the first portion Cst-1 of the capacitor Cst and the gate G2. The third insulating layer 30 may be provided with the second gate contact hole CNT-T2, the second-second semiconductor contact holes CNT-S22, and the second data contact holes CNT-D2, which are defined therethrough.

The second gate contact hole CNT-T2 may expose a portion of the first portion Cst-1 of the capacitor Cst. A portion of the source S2 included in the second transistor T2 may be exposed via one of the second-second semiconductor contact holes CNT-S22, and a portion of the drain D2 included in the second transistor T2 may be exposed via another of the second-second semiconductor contact holes CNT-S22.

The second portion Cst-2 of the capacitor Cst, the first sub-pattern CP1, and the second sub-pattern CP2 may be disposed on the third insulating layer 30.

One end of the first sub-pattern CP1 may be electrically connected to the third data line DL3 via the first data contact hole CNT-D1 and the second data contact holes CNT-D2. Another end of the first sub-pattern CP1 may be electrically connected to the source S2 via the contact hole, which overlaps the source S2 in a plan view, among the second-second semiconductor contact holes CNT-S22. Accordingly, the second transistor T2 may be electrically connected to the third data line DL3 via the first sub-pattern CP1.

One end of the second sub-pattern CP2 may be electrically connected to the drain D2 of the second transistor T2 via the second gate contact hole CNT-T2. Another end of the second sub-pattern CP2 may be electrically connected to the drain D2 via the contact hole, which overlaps the drain D2 in a plan view, among the second-second semiconductor contact holes CNT-S22.

The fourth insulating layer 40 may be disposed on the third insulating layer 30 and may cover the second portion Cst-2 of the capacitor Cst, the first sub-pattern CP1, and the second sub-pattern CP2. The fourth insulating layer 40 may be provided with the first anode contact hole EL-S1 defined therethrough and expose the portion of the second portion Cst-2 of the capacitor Cst.

The fifth insulating layer 50 may be disposed on the fourth insulating layer 40 and may be provided with the second anode contact hole EL-S2 overlapping the first anode contact hole EL-S1 in a plan view.

The first electrode AE may be electrically connected to the second portion Cst-2 of the capacitor Cst via the first anode contact hole EL-S1 and the second anode contact hole EL-S2.

Figure 8:
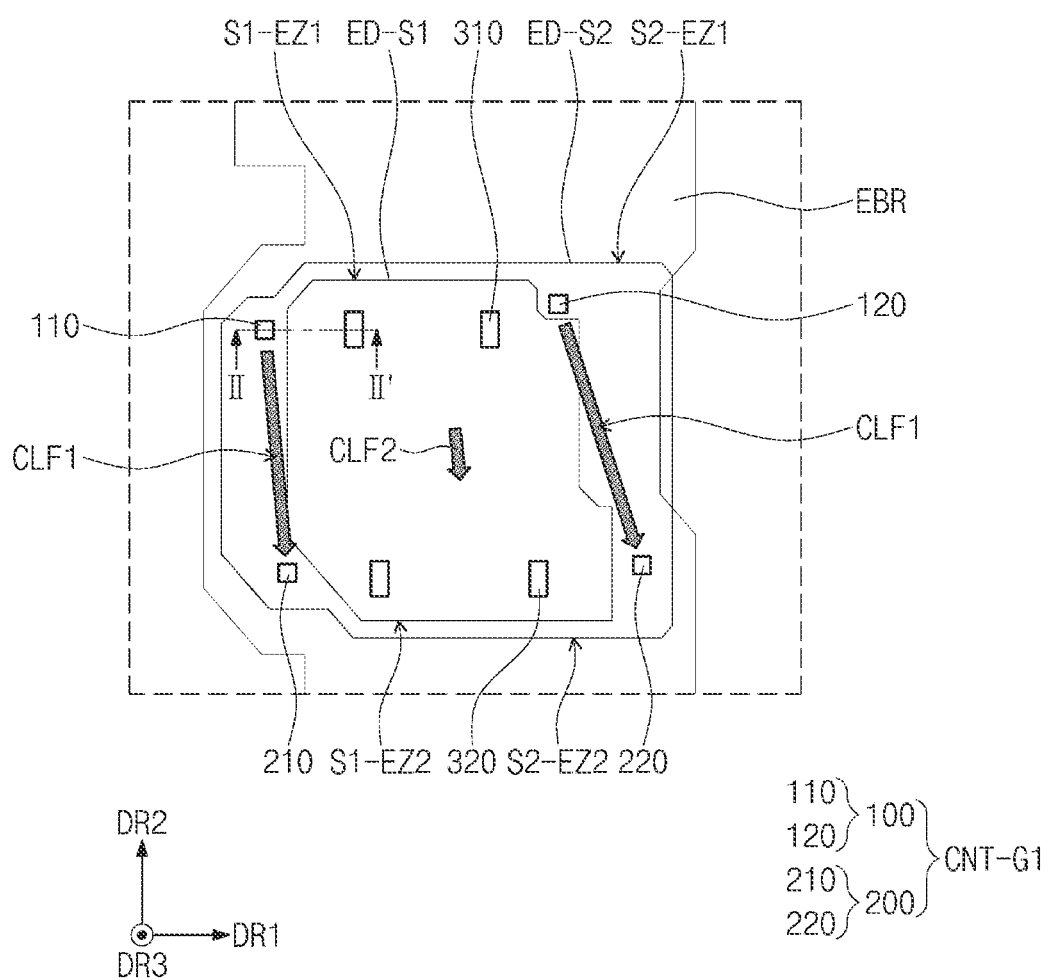
FIG. 8 is a schematic enlarged plan view of first to fourth contact holes according to an embodiment of the disclosure.
Figure 9:
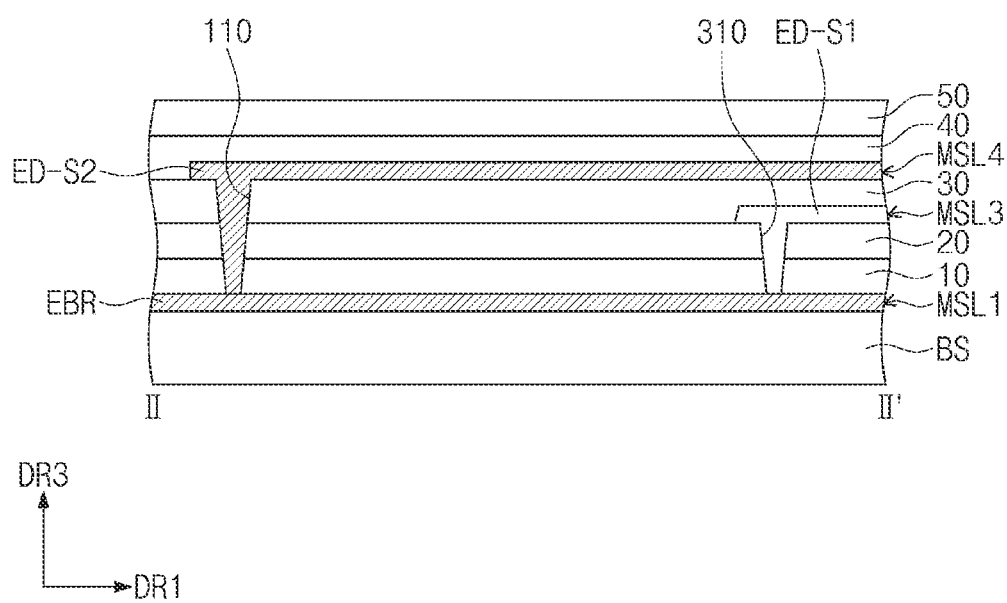
FIG. 9 is a schematic cross-sectional view taken along a line II-IF of FIG. 8.

FIG. 8 is a schematic enlarged plan view of first to fourth contact holes according to an embodiment of the disclosure. FIG. 9 is a schematic cross-sectional view taken along a line II-IF of FIG. 8.

FIG. 8 is an enlarged view showing the first contact hole group CNT-G1 (refer to FIG. 6B) of FIGS. 6B to 6K. FIG. 8 shows directions of current flows CLF1 and CLF2 flowing through the first contact hole 100, the second contact hole 200, and the second additional power pattern ED-S2. FIG. 8 shows the first contact hole group CNT-G1 (refer to FIG. 6B) as a representative example. Since the second contact hole group CNT-G2 (refer to FIG. 6B) and the third contact hole group CNT-G3 (refer to FIG. 6B) may be arranged in substantially the same manner as and may have substantially the same structure as the first contact hole group CNT-G1 (refer to FIG. 6B), details described below may be equally applied to the second contact hole group CNT-G2 and the third contact hole group CNT-G3.

As described with reference to FIGS. 6A to 6K, the power pattern EBR may be electrically connected to the first additional power pattern ED-S1 and the second additional power pattern ED-S2. The power pattern EBR and the first additional power pattern ED-S1 may be electrically connected to each other via the third and fourth contact holes 310 and 320 of the first power contact holes CNT-P1. The power pattern EBR may be electrically connected to the second additional power pattern ED-S2 via the first and second contact holes 100 and 200 of the first contact hole group CNT-G1 of the second power contact holes CNT-V1.

The current flow CLF1 between the power pattern EBR and the second additional power pattern ED-S2 may be directed (or may flow) from the first contact hole 100 to the second contact hole 200. For example, the current flow CLF1 may be directed (or may flow) in second direction DR2 in a plan view.

The first hole 110 may correspond to the third hole 210, and the second hole 120 may correspond to the fourth hole 220. For example, the first hole 110 and the third hole 210 may be disposed adjacent to each other in the second direction DR2, and the second hole 120 and the fourth hole 220 may be disposed adjacent to each other in the second direction DR2. Holes adjacent to each other in the second direction DR2 may correspond to each other, and a current may flow in a direction between the holes (e.g., the adjacent holes) corresponding to each other.

The current flowing in the second direction DR2 may flow from the first hole 110 to the third hole 210 and may flow from the second hole 120 to the fourth hole 220. For example, a portion of the current flow CLF1 between the power pattern EBR and the second additional power pattern ED-S2 may be directed (or may flow) from the first hole 110 to the third hole 210, and another portion of the current flow CLF1 may be directed (or may flow) from the second hole 120 to the fourth hole 220.

The number of the first holes 110 may be the same as the number of the third holes 210 corresponding to the first holes 110, and the number of the second holes 120 may be the same as the number of the fourth holes 220 corresponding to the second holes 120. As shown in FIG. 8, when the number of the first holes 110 is one, the number of the third holes 210 may be one. When the number of the second holes 120 is one, the number of the fourth holes 220 may be one. According to the embodiment, the holes corresponding to each other may be provided in a same number, and thus, an increase of a resistance, which is caused by a bottleneck phenomenon occurring when a current flows between the holes provided with different numbers, may be prevented.

The first contact hole 100 and the second contact hole 200 may have a same size. For example, the first hole 110 and the third hole 210 corresponding to the first hole 110 may have substantially a same size. The second hole 120 and the fourth hole 220 corresponding to the second hole 120 may have substantially a same size. The size of the first hole 110 may be different from the size of the second hole 120, and the size of the third hole 210 may be different from the size of the fourth hole 220. The size may mean an area. As the holes corresponding to each other have a same size, the bottleneck phenomenon of the current flow CLF1 may be prevented from occurring, and the resistance may be reduced.

The current flow CLF2 between the power pattern EBR of the first conductive layer MSL1 and the first additional power pattern ED-S1 of the third conductive layer MSL3 may be directed (or may flow) from the third contact hole 310 to the fourth contact hole 320.

The number of the third contact holes 310 may be substantially the same as the number of the fourth contact holes 320. In FIG. 8, two third contact holes 310 and two fourth contact holes 320 are illustrated. However, the number of the third and fourth contact holes 310 and 320 is not limited thereto or thereby. As an example, the number of each of the third contact holes 310 and the fourth contact holes 320 may be five as shown in FIGS. 6B to 6K. The third contact hole 310 and the fourth contact hole 320 may have a same size.

The first contact hole 100 may be adjacent to the second upper edge S2-EZ1 of the second additional power pattern ED-S2. The second contact hole 200 may be adjacent to the second lower edge S2-EZ2 of the second additional power pattern ED-S2. The first hole 110 and the second hole 120 may be spaced apart from each other in the first direction DR1. The third contact hole 310 may be defined between the first hole 110 and the second hole 120. The third hole 210 and the fourth hole 220 may be spaced apart from each other, and the fourth contact hole 320 may be defined between the third hole 210 and the fourth hole 220.

FIG. 9 is a cross-sectional view of a portion of the display panel including the first contact hole 100 and the third contact hole 310 of FIG. 8.

Referring to FIG. 9, the third conductive layer MSL3 may include the first additional power pattern ED-S1. The first additional power pattern ED-S1 may be disposed on the second insulating layer 20. The third contact hole 310 may penetrate through the first insulating layer 10 and the second insulating layer 20. The power pattern EBR may be electrically connected to the first additional power pattern ED-S1 via the third contact hole 310.

The fourth conductive layer MSL4 may include the second additional power pattern ED-S2. The second additional power pattern ED-S2 may be disposed on the third insulating layer 30. The first hole 110 of the first contact hole 100 may penetrate through the first insulating layer 10, the second insulating layer 20, and the third insulating layer 30. The power pattern EBR may be electrically connected to the second additional power pattern ED-S2 via the first hole 110. For example, the first additional power pattern ED-S1 and the second additional power pattern ED-S2 may be disposed on different layers from each other.

Figure 10A:
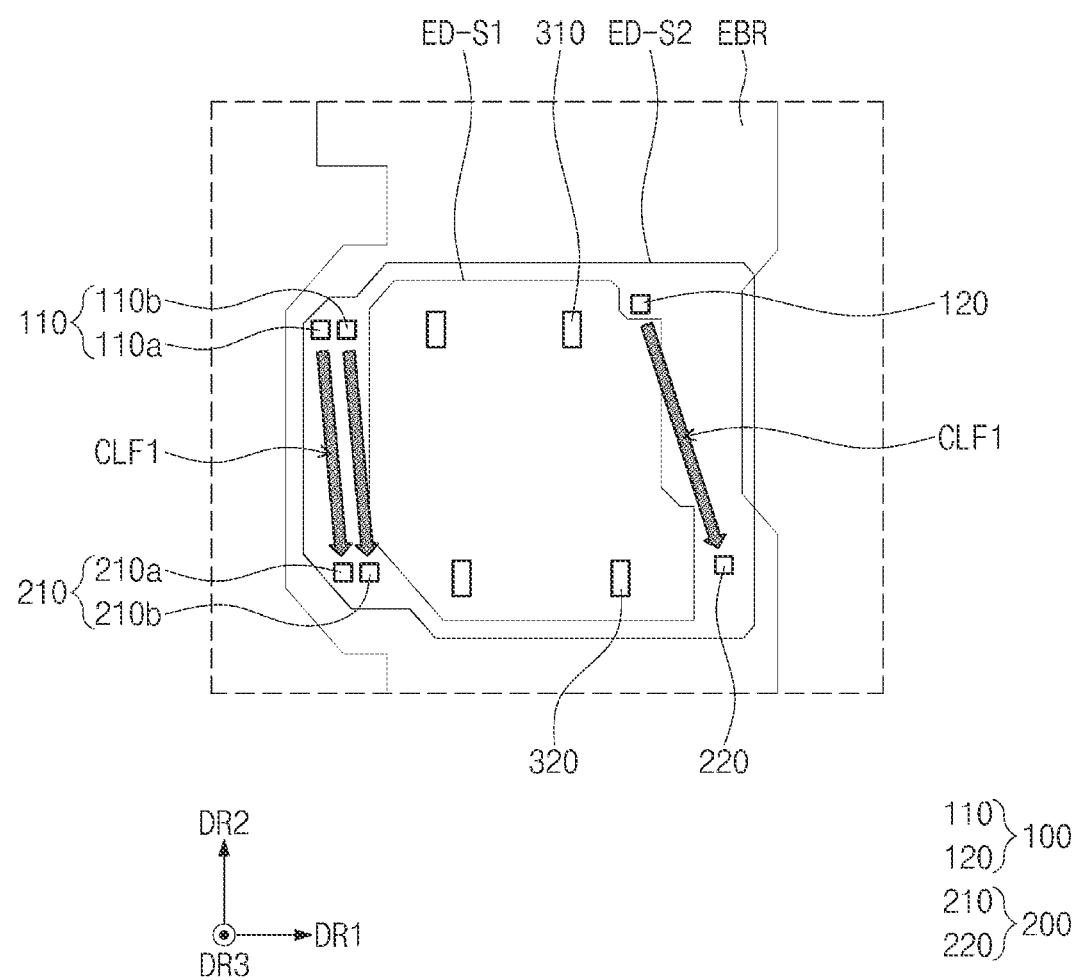
FIGS. 10A and 10B are schematic enlarged plan views of first to fourth contact holes according to an embodiment of the disclosure.
Figure 10B:
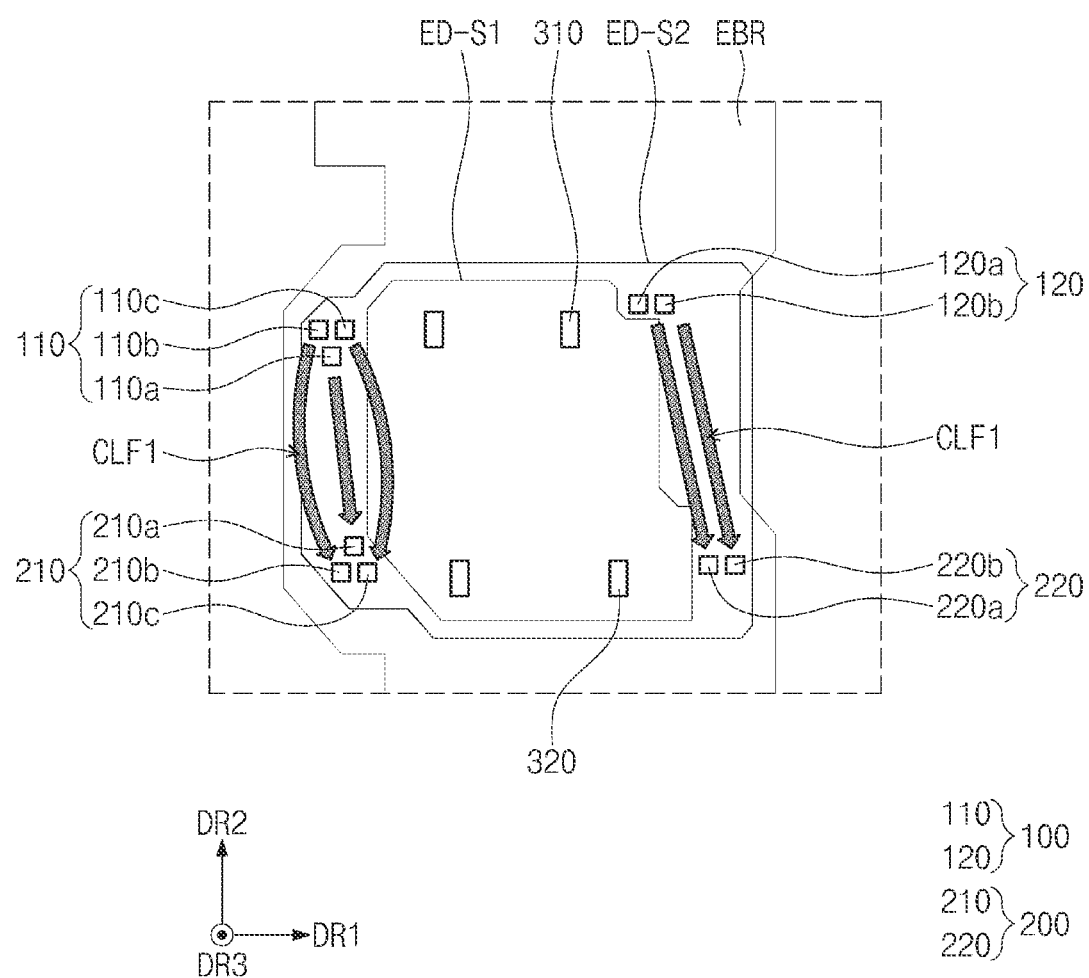

FIGS. 10A and 10B are schematic enlarged plan views of first, second, third, and fourth contact holes according to embodiments of the disclosure.

FIGS. 10A and 10B show a first contact hole 100 and a second contact hole 200, each having multiple holes.

Referring to FIG. 10A, the first contact hole 100 may include two first holes 110a and 110b and a second hole 120. The second contact hole 200 may include two third holes 210a and 210b respectively corresponding to the first holes 110a and 110b and a fourth hole 220 corresponding to the second hole 120. For example, the number of the first holes 110a and 110b may be different from the number of the second holes 120. However, the number of the first holes 110a and 110b may be the same as the number of the third holes 210a and 210b corresponding to the first holes 110a and 110b. The number of the second holes 120 may be the same as the number of the fourth holes 220.

A current flow CLF1 may be directed (or may flow) from the first holes 110a and 110b to the third holes 210a and 210b. As an example, a portion of a current may flow from the first hole 110a disposed at a left side in the first direction DR1 to the third hole 210a, and a portion of the current may flow from the first hole 110b disposed at a right side in the first direction DR1 to the third hole 210b. The two first holes 110a and 110b may have different sizes from each other. However, the first holes 110a and 110b and the corresponding third holes 210a and 210b may have a same size. For example, the left first hole 110a and the left third hole 210a may have a same size, and the right first hole 110b and the right third hole 210b may have a same size. The second hole 120 and the fourth hole 220 may have a same size.

Referring to FIG. 10B, each of the first contact hole 100 and the second contact hole 200 may be provided in plural. The number of the first contact holes 100 may be the same as the number of the second contact holes 200. As an example, five first contact holes 100 and five second contact holes 200 may be provided in the embodiment.

The first contact hole 100 may include three first holes 110a, 110b, and 110c and two second holes 120a and 120b. The second contact hole 200 may include three third holes 210a, 210b, and 210c and two fourth holes 220a and 220b. A current flow CLF1 may be directed (or may flow) from the first contact hole 100 to the second contact hole 200 in the second direction DR2. The current flow CLF1 may be directed (or may flow) from the first holes 110a, 110b, and 110c to the third holes 210a, 210b, and 210c respectively corresponding to the first holes 110a, 110b, and 110c and may be directed (or may flow) from the second holes 120a and 120b to the fourth holes 220a and 220b respectively corresponding to the second holes 120a and 120b. The first holes 110a, 110b, and 110c and the third holes 210a, 210b, and 210c may have a same size, and the second holes 120a and 120b and the fourth holes 220a and 220b may have a same size.

FIGS. 8 to 10B show the enlarged views of the first contact hole group, however, as described above, other contact hole groups arranged in the second direction DR2 may include a first contact hole 100 and a second contact hole 200, which have a same arrangement and a same size. Details described with reference to FIGS. 8 to 10B may be applied to other contact hole groups (e.g., the second contact hole group CNT-G2 of FIG. 6B and the third contact hole group CNT-G3 of FIG. 6B).

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display panel comprising:
   a base layer;
   a first conductive layer disposed on the base layer and comprising a power pattern;
   a second conductive layer disposed on the first conductive layer; and
   a first insulating layer disposed between the first conductive layer and the second conductive layer, wherein
   the first insulating layer is provided with:
   at least one first contact hole defined through the first insulating layer and disposed at an upper side of the first insulating layer in a plan view; and
   at least one second contact hole defined through the first insulating layer and disposed at a lower side of the first insulating layer in a plan view,
   the first conductive layer is electrically connected to the second conductive layer via the at least one first contact hole and the at least one second contact hole, and
   a number of the at least one first contact hole is equal to a number of the at least one second contact hole.

2. The display panel of claim 1, wherein
   the second conductive layer comprises at least one additional power pattern overlapping the power pattern in a plan view, and
   the power pattern is electrically connected to the at least one additional power pattern via the at least one first contact hole and the at least one second contact hole.

3. The display panel of claim 2, wherein
   the at least one additional power pattern comprises:
   an upper edge; and
   a lower edge,
   the at least one first contact hole is adjacent to the upper edge, and
   the at least one second contact hole is adjacent to the lower edge.

4. The display panel of claim 2, wherein
   the at least one additional power pattern includes a plurality of additional power patterns,
   the first insulating layer comprises a plurality of contact hole groups respectively disposed between a corresponding one of the at least one additional power pattern and the power pattern, and
   each of the plurality of contact hole groups comprises the at least one first contact hole and the at least one second contact hole, a number of the at least one first contact hole being equal to a number of the at least one second contact hole in each of the plurality of contact hole groups.

5. The display panel of claim 1, wherein the at least one first contact hole and the at least one second contact hole have a same size.

6. The display panel of claim 1, wherein
   the at least one first contact hole comprises:
   at least one first hole; and
   at least one second hole spaced apart from the at least one first hole in a first direction,
   the at least one second contact hole comprises:
   at least one third hole; and
   at least one fourth hole spaced apart from the at least one third hole in the first direction,
   the at least one first hole is adjacent to the at least one third hole in a second direction intersecting the first direction, and
   the at least one second hole is adjacent to the at least one fourth hole in the second direction.

7. The display panel of claim 6, wherein
   a number of the at least one first hole is equal to a number of the at least one third hole, and
   a number of the at least one second hole is equal to a number of the at least one fourth hole.

8. The display panel of claim 6, wherein
   the at least one first hole and the at least one third hole have a same size, and
   the at least one second hole and the at least one fourth hole have a same size.

9. The display panel of claim 1, further comprising:
   a third conductive layer disposed between the first conductive layer and the second conductive layer; and
   a second insulating layer disposed between the first conductive layer and the third conductive layer.

10. The display panel of claim 9, wherein
    the second insulating layer is provided with:
    at least one third contact hole disposed at an upper side of the second insulating layer in a plan view; and
    at least one fourth contact hole disposed at a lower side of the second insulating layer in a plan view,
    the first conductive layer is electrically connected to the third conductive layer via the at least one third contact hole and the at least one fourth contact hole, and
    a number of the at least one third contact hole is equal to a number of the at least one fourth contact hole.

11. The display panel of claim 10, wherein the at least one third contact hole and the at least one fourth contact hole have a same size.

12. The display panel of claim 1, further comprising:
    a pixel comprising:
    a transistor comprising:
    a semiconductor pattern; and
    a gate; and
    a light emitting element electrically connected to the transistor,
    wherein the power pattern is electrically connected to the pixel.

13. A display panel comprising:
    a base layer;
    a first conductive layer disposed on the base layer and comprising a power pattern;
    a second conductive layer disposed on the first conductive layer; and
    a first insulating layer disposed between the first conductive layer and the second conductive layer, wherein in case that a current flows from a first side to a second side in a first direction, the first insulating layer is provided with:
at least one first contact hole adjacent to the first side in a plane; and
at least one second contact hole adjacent to the second side in the plane,
the first conductive layer is electrically connected to the second conductive layer via the at least one first contact hole and the at least one second contact hole, and
a number of the at least one first contact hole is equal to a number of the at least one second contact hole.

14. The display panel of claim 13, wherein the current flows to the at least one second contact hole after passing through the at least one first contact hole.

15. The display panel of claim 13, wherein the at least one first contact hole and the at least one second contact hole have a same size.

16. The display panel of claim 13, wherein
the at least one first contact hole includes a plurality of first contact holes, and
the at least one second contact hole includes a plurality of second contact holes.

17. The display panel of claim 16, wherein
the plurality of first contact holes comprise:
at least one first hole; and
at least one second hole spaced apart from the at least one first hole in a second direction intersecting the first direction, and
the plurality of second contact holes comprise:
at least one third hole; and
at least one fourth hole spaced apart from the at least one third hole in the second direction,
the at least one first hole is adjacent to the at least one third hole in the first direction, and
the at least one second hole is adjacent to the at least one fourth hole in the first direction.

18. The display panel of claim 17, wherein the current flows from the at least one first hole to the at least one third hole and flows from the at least one second hole to the at least one fourth hole.

19. The display panel of claim 17, wherein
a number of the at least one first hole is equal to a number of the at least one third hole, and
a number of the at least one second hole is equal to a number of the at least one fourth hole.

20. The display panel of claim 17, wherein
the at least one first hole and the at least one third hole have a same size, and
the at least one second hole and the at least one fourth hole have a same size.

* * * * *